(12) United States Patent
Chang et al.

(10) Patent No.: US 12,234,141 B2
(45) Date of Patent: Feb. 25, 2025

(54) OUTGASSING MATERIAL COATED CAVITY FOR A MICRO-ELECTRO MECHANICAL SYSTEM DEVICE AND METHODS FOR FORMING THE SAME

(71) Applicant: Taiwan Semiconductor Manufacturing Company Limited, Hsinchu (TW)

(72) Inventors: Kuei-Sung Chang, Kaohsiung (TW); Tai-Bang An, New Taipei (TW); Chun-Wen Cheng, Zhubei (TW); Hung-Hua Lin, Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/358,175

(22) Filed: Jul. 25, 2023

(65) Prior Publication Data

US 2023/0365398 A1   Nov. 16, 2023

Related U.S. Application Data

(63) Continuation of application No. 17/496,815, filed on Oct. 8, 2021, now Pat. No. 11,827,513, which is a
(Continued)

(51) Int. Cl.
*B81B 7/00* (2006.01)
*B81C 1/00* (2006.01)

(52) U.S. Cl.
CPC ........ *B81B 7/0038* (2013.01); *B81C 1/00285* (2013.01); *B81B 2207/015* (2013.01); *B81C 2203/0136* (2013.01)

(58) Field of Classification Search
CPC ............ B81B 7/0038; B81B 2207/015; B81B 2201/0235; B81B 2201/0242; B81B 7/02;
(Continued)

(56) References Cited

U.S. PATENT DOCUMENTS

2009/0120830 A1   5/2009  Livingston
2012/0097415 A1*  4/2012  Reinert ............ H01L 27/14683
                                                              174/50
(Continued)

FOREIGN PATENT DOCUMENTS

| CN | 105776123 A | 7/2016 |
|----|----|----|
| CN | 106145025 A | 11/2016 |
| CN | 110636422 A | 12/2019 |
| JP | 2017501041 A | 1/2017 |
| TW | 200848360 A | 12/2008 |
| TW | 201945273 A | 12/2019 |

OTHER PUBLICATIONS

Jianq Chyun Intellectual Property Office, CN Application No. 202010332779.2; Notice of Allowance mailed Jun. 18, 2024; 10pages.

*Primary Examiner* — Yasser A Abelaziez
(74) *Attorney, Agent, or Firm* — The Marbury Law Group, PLLC

(57) ABSTRACT

A MEMS support structure and a cap structure are provided. At least one vertically-extending trench is formed into the MEMS support structure or a portion of the cap structure. A vertically-extending outgassing material portion having a surface that is physically exposed to a respective vertically-extending cavity is formed in each of the at least one vertically-extending trench. A matrix material layer is attached to the MEMS support structure. A movable element laterally confined within a matrix layer is formed by patterning the matrix material layer. The matrix layer is bonded to the cap structure. A sealed chamber containing the movable element is formed. Each vertically-extending outgassing material portion has a surface that is physically exposed
(Continued)

to the sealed chamber, and outgases a gas to increase the pressure in the sealed chamber.

20 Claims, 24 Drawing Sheets

Related U.S. Application Data continuation of application No. 16/784,451, filed on Feb. 7, 2020, now Pat. No. 11,180,363.

(58) Field of Classification Search
CPC ............ B81B 2201/02; B81C 1/00285; B81C 2203/0136; B81C 3/001; B81C 2203/03
See application file for complete search history.

(56) References Cited

U.S. PATENT DOCUMENTS

| 2015/0129991 A1 | 5/2015 | Lee et al. |
| 2015/0284240 A1 | 10/2015 | Chu et al. |
| 2015/0360939 A1 | 12/2015 | Zhang et al. |
| 2017/0203962 A1 | 7/2017 | Cheng et al. |
| 2017/0210619 A1 | 7/2017 | Chang et al. |
| 2017/0297904 A1* | 10/2017 | Lin .................... B81C 1/00285 |

* cited by examiner

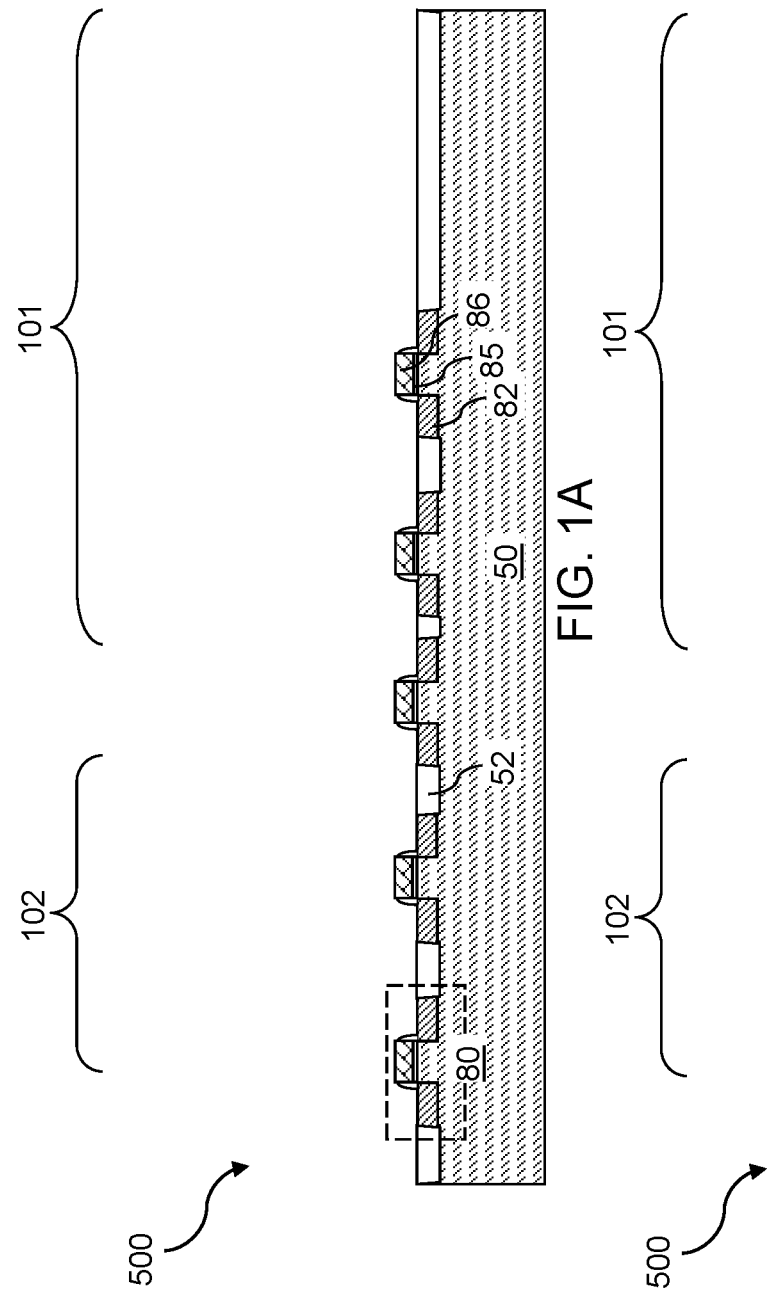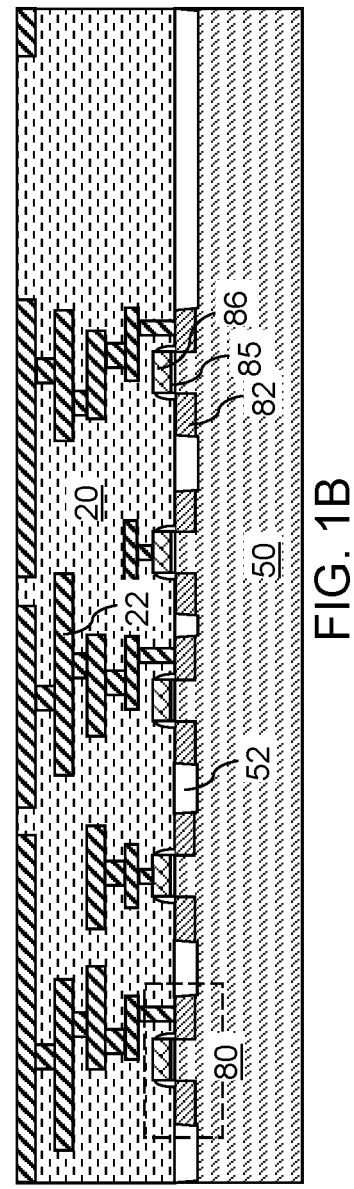

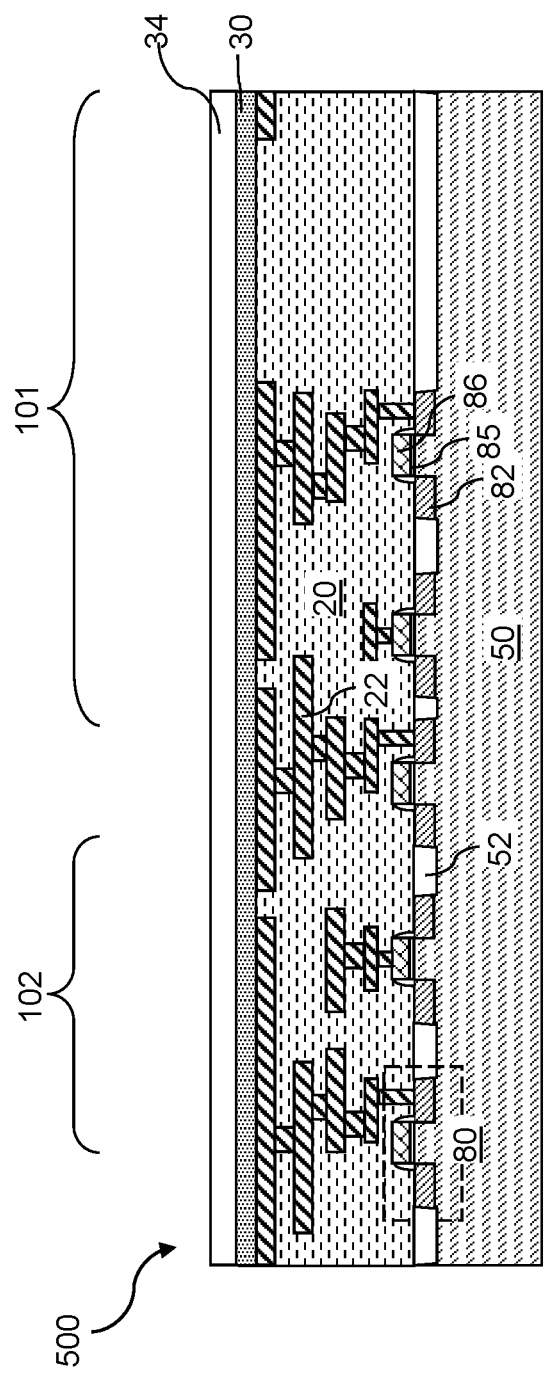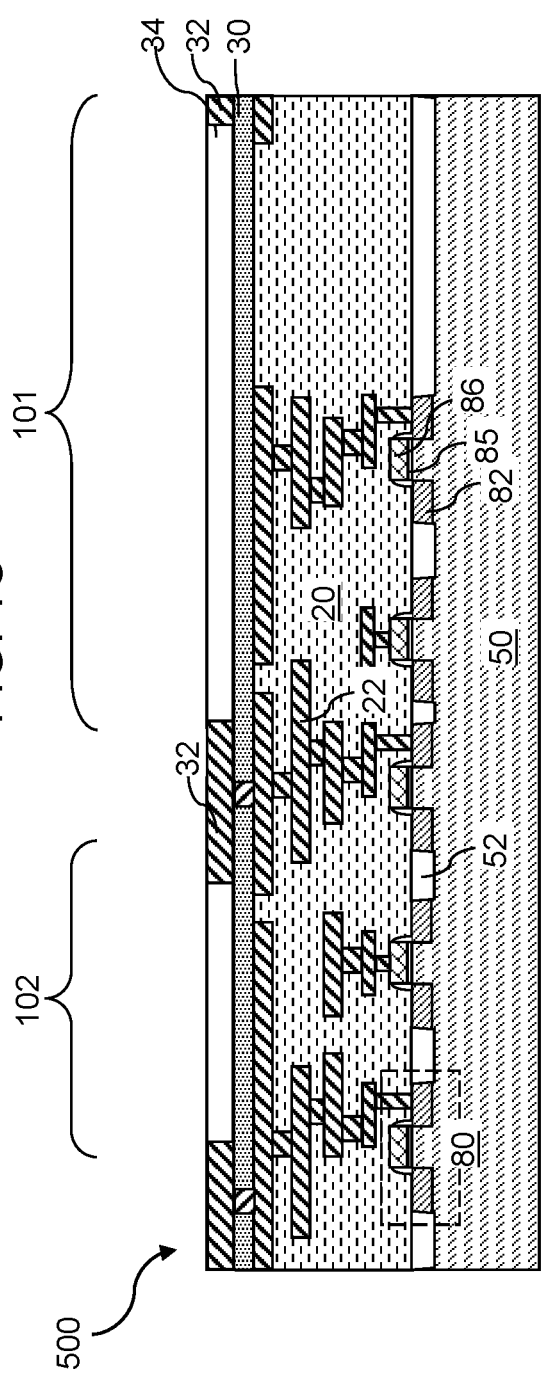

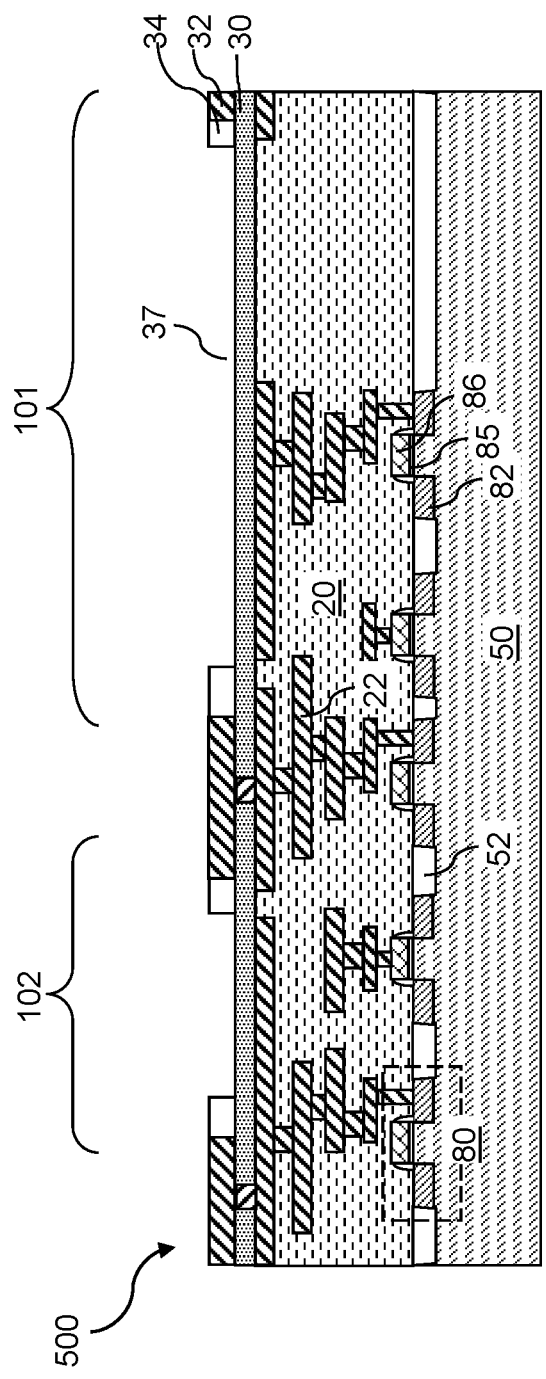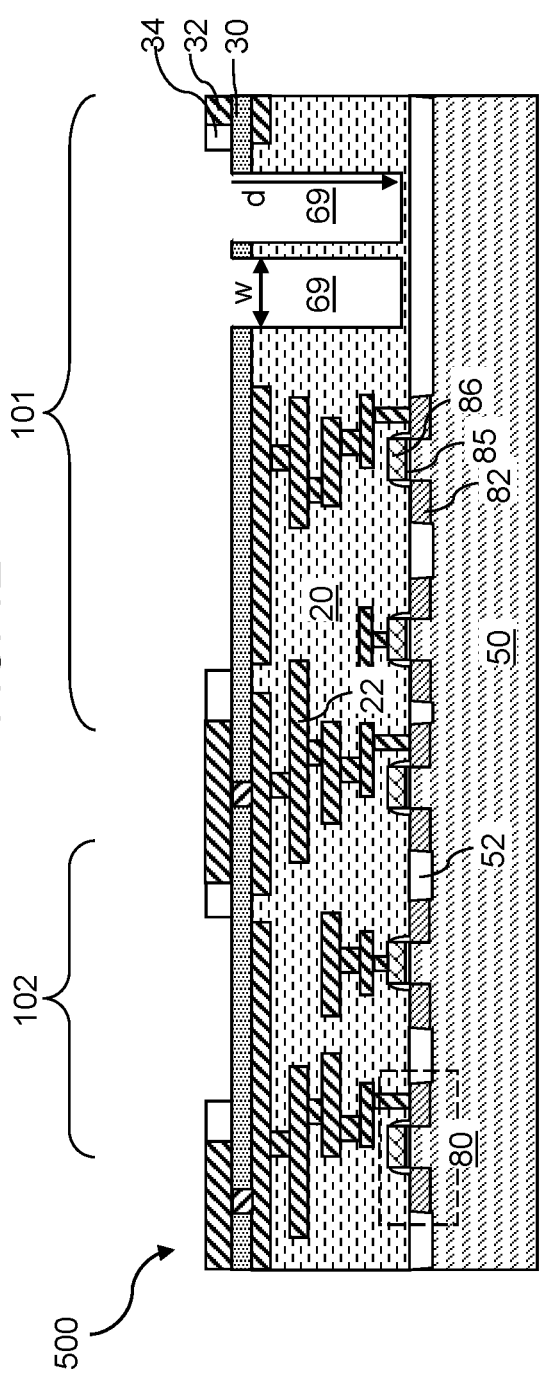

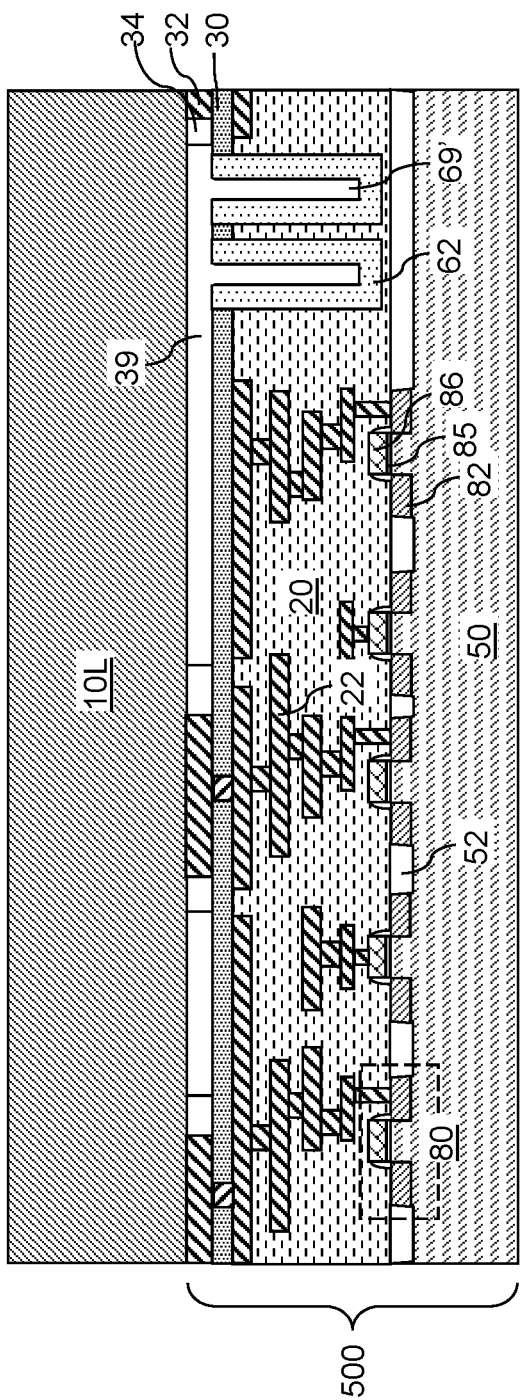
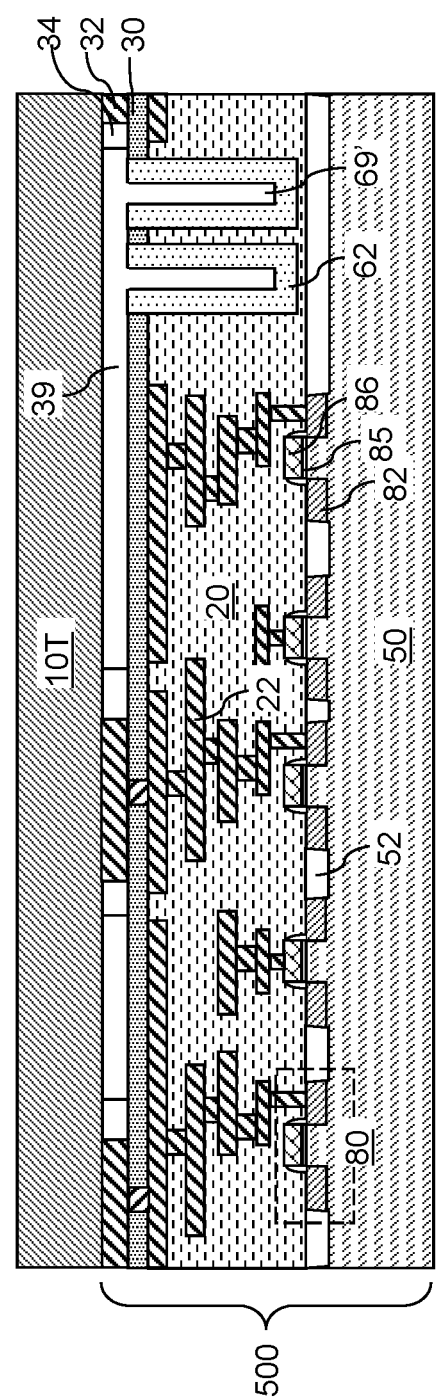
FIG. 1I
FIG. 1J

OUTGASSING MATERIAL COATED CAVITY FOR A MICRO-ELECTRO MECHANICAL SYSTEM DEVICE AND METHODS FOR FORMING THE SAME

RELATED APPLICATION

The instant application is a divisional application of U.S. application Ser. No. 17/496,815 entitled "Outgassing Material Coated Cavity for a Micro-Electro Mechanical System Device and Methods for Forming the Same," filed on Oct. 8, 2021, which is continuation application of U.S. application Ser. No. 16/784,451 entitled "Outgassing Material Coated Cavity for a Micro-Electro Mechanical System Device and Methods for Forming the Same," filed on Feb. 7, 2020, the entire contents of both of which are incorporated herein by reference for all purposes.

BACKGROUND

Micro-electro mechanical system (MEMS) devices include devices fabricated using semiconductor technology to form mechanical and electrical features. MEMS devices may include moving parts having dimensions of microns or sub-microns and a mechanism for electrically coupling the moving parts to an electrical signal, which may be an input signal that induces movement of the moving parts or an output signal that is generated by the movement of the moving parts. MEMS devices are useful devices that may be integrated with other devices, such as semiconductor devices, to function as sensors or as actuators.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a vertical cross-sectional view of a MEMS support structure after formation of semiconductor devices such as field effect transistors in accordance with a first embodiment of the present disclosure.

FIG. 1B is a vertical cross-sectional view of the MEMS support structure after formation of interconnect-level dielectric material layers and metal interconnect structures in accordance with the first embodiment of the present disclosure.

FIG. 1C is a vertical cross-sectional view of the MEMS support structure after formation of an etch stop dielectric material layer and a bonding-level dielectric material layer in accordance with the first embodiment of the present disclosure.

FIG. 1D is a vertical cross-sectional view of the MEMS support structure after formation of bonding-level metal interconnect structures in accordance with the first embodiment of the present disclosure.

FIG. 1E is a vertical cross-sectional view of the MEMS support structure after formation of recess regions in accordance with the first embodiment of the present disclosure.

FIG. 1F is a vertical cross-sectional view of the MEMS support structure after formation of vertically-extending trenches in accordance with the first embodiment of the present disclosure.

FIG. 1I is a vertical cross-sectional shape of an exemplary structure for forming a MEMS device after formation of an assembly of the MEMS support structure and a matrix material layer in accordance with the first embodiment of the present disclosure FIG. 1J is a vertical cross-sectional view of the exemplary structure after thinning the matrix material layer in accordance with the first embodiment of the present disclosure.

DETAILED DESCRIPTION

Figure 1G:
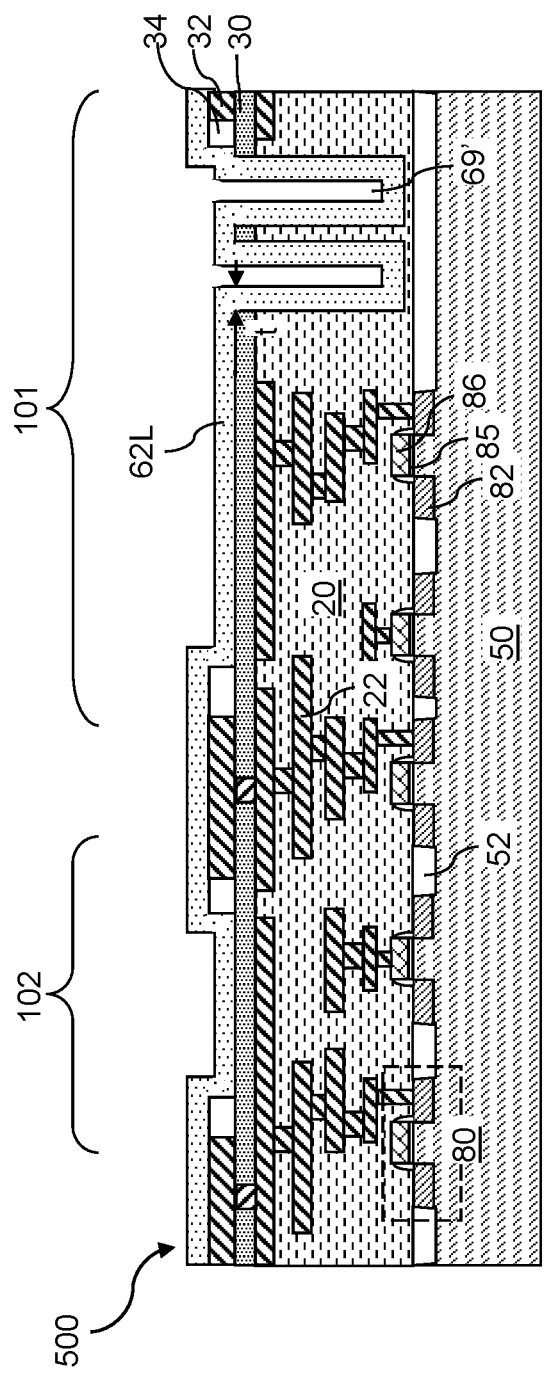
FIG. 1G is a vertical cross-sectional view of the MEMS support structure after formation of an outgassing-material-containing layer in accordance with the first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are directed to micro-electro mechanical system (MEMS) device containing outgassing-material-containing portions located in vertically-extending cavities configured to release gas into a sealed chamber and method for forming the same. Some MEMS devices may include a sealed chamber containing a movable element. For example, the MEMS device may include a moving plate (i.e., movable elements) or sensing element that registers the acceleration of the device or angular velocity of the device. The optimal condition for operation of the movable element may include a gaseous ambient, which can be provided by including a gas source connected to the sealed chamber. Various embodiments described herein provide an increased gas supply into sealed chambers by using vertically-extending trenches that contain outgassing material portions with physically exposed surfaces. The vertically extending trenches may provide an increased surface area from which the gas supply may emanate. An increase in the pressure of a gas ambient can provide enhanced performance for some types of MEMS devices, such as an accelerometer.

Referring to FIG. 1A, an exemplary structure for forming a MEMS assembly in accordance with a first embodiment of the present disclosure is illustrated. The exemplary structure includes a substrate. At least one micro-electro mechanical system (MEMS) device may be subsequently formed on the substrate. For this reason, the substrate is herein referred to as a micro-electro mechanical system substrate, or a MEMS substrate 50. The MEMS substrate 50 may have a thickness in a range from 30 microns to 3 mm, such as from 100 microns to 1 mm, although lesser and greater thicknesses may also be used. The MEMS substrate 50 may be a semiconductor substrate, a conductive substrate, an insulating substrate, or a composite substrate including multiple layers. In one embodiment, the MEMS substrate 50 may be a semiconductor substrate such as a commercially available single crystalline silicon wafer having a diameter in a range from 150 mm to 450 mm and having a thickness in a range from 500 microns to 1,000 microns.

In an embodiment the MEMS substrate 50 includes a semiconductor substrate, semiconductor devices 80 may be formed on a top surface of the MEMS substrate 50. The semiconductor devices 80 that may be formed on the top surface of the MEMS substrate 50 include, but are not limited to, field effect transistors, bipolar transistors, diodes, capacitors, resistors, or other semiconductor devices known in the art. In an embodiment, the semiconductor devices 80 include field effect transistors, each field effect transistor may include active regions 82 (such as source regions and drain regions), a gate dielectric 85, and a gate electrode 86. Shallow trench isolation structures 52 or other suitable isolation structures may be formed between neighboring devices. The shallow trench isolation structures 52 may provide electrical isolation between the various semiconductor devices 80 on the MEMS substrate 50. The semiconductor devices 80 may comprise a circuit configured to interface with, control, and/or sense various components with the at least one MEMS device to be subsequently formed thereabove.

The combination of the MEMS substrate 50 and a set of structures formed thereupon, and/or to be subsequently formed thereupon, provides structural support to the at least one micro-electro mechanical system (MEMS) device to be subsequently formed. In other words, the combination of the MEMS substrate 50 and the set of material portions to be formed thereupon functions as a support structure for the at least one MEMS device. As such, the combination of the MEMS substrate 50 and the set of material portions formed thereupon, or to be formed thereupon, is hereafter referred to as a micro-electro mechanical system support structure 500, or a MEMS support structure 500. The exemplary structure includes a first device region 101 in which a first MEMS device is to be subsequently formed, and a second device region 102 in which a second MEMS device is to be subsequently formed. In a non-limiting illustrative example, components for an accelerometer for measuring linear acceleration may be formed in the first device region 101 and a gyroscope for measuring angular velocity may be formed in the second device region 102. In other non-limiting embodiments, a structure may be formed with repetitive first device regions 101 or second device regions 102 to form a plurality of the same type of sensor.

Referring to FIG. 1B, interconnect-level dielectric material layers 20 and metal interconnect structures 22 may be formed over the semiconductor devices 80. The interconnect-level dielectric material layers 20 may include multiple dielectric material layers that are vertically stacked to accommodate metal interconnect structures 22 that may be formed at different metal interconnect levels. Each of the interconnect-level dielectric material layers 20 may include a dielectric material such as silicon oxide, silicon nitride, organosilicate glass, a porous low-k dielectric material, or a spin-on glass (SOG) material. Other suitable materials within the contemplated scope of disclosure may also be used. The interconnect-level dielectric material layers 20 may be deposited by chemical vapor deposition, physical vapor deposition, or spin-on coating. The thickness of each interconnect-level dielectric material layer 20 can be in a range from 100 nm to 600 nm, although lesser and greater thicknesses can also be used. The metal interconnect structures 22 may include various metal via structures and various metal line structures that provide electrical connection among the various semiconductor devices 80 and among various nodes of the semiconductor devices 80 and nodes of MEMS devices to be subsequently formed. In one embodiment, at least portion of the first device region 101 may be free of metal interconnect structures 22 so that vertically-extending trenches can be subsequently formed therein.

Referring to FIG. 1C, an etch stop dielectric material layer 30 may be formed over the interconnect-level dielectric material layers 20. The etch stop dielectric material layer 30 can include silicon nitride or a dielectric metal oxide (such as aluminum oxide), and can have a thickness in a range from 30 nm to 100 nm, although lesser and greater thicknesses can also be employed. A bonding-level dielectric material layer 34 may be formed over the etch stop dielectric material layer 30. The bonding-level dielectric material layer 34 may include silicon oxide such as TEOS oxide, which is an oxide material formed by decomposition of tetraethylorthosilicate (TEOS). The thickness of the bonding-level dielectric material layer 34 may be in a range from 200 nm to 3,000 nm, although lesser and greater thicknesses can also be employed.

Referring to FIG. 1D, bonding-level metal interconnect structures 32 may be formed in the bonding-level dielectric material layer 34 and the etch stop dielectric material layer 30. The bonding-level metal interconnect structures 32 may include metal line structures, metal via structures, or a combination thereof (such as integrated line and via structures). For example, via cavities, line cavities, and/or pad cavities can be formed in the bonding-level dielectric material layer 34 and the etch stop dielectric material layer 30, and may be filled with at least one metallic fill material to form the bonding-level metal interconnect structures 32.

Referring to FIG. 1E, recess region 37 may be formed by vertically recessing portions of the top surface of the bonding-level dielectric material layer 34. The top surface of the etch stop dielectric material layer 30 may be employed as an etch stop surface. The recess regions 37 may be formed in areas in which movable elements of MEMS devices may be subsequently formed. The lateral extent of each recess region 37 is on the order of the lateral extent of a respective movable element that may be subsequently formed, and may be in a range from 10 microns to 5 mm, although lesser and greater dimensions may also be employed. Each recess region 37 may have a respective horizontal bottom surface, which may be the top surface of the etch stop dielectric material layer 30.

Referring to FIG. 1F, a photoresist layer (not shown) may be applied over the physically exposed surface of the etch stop dielectric material layer 30, the bonding-level dielectric material layer 34, and the bonding-level metal interconnect structures 32. The photoresist layer may be lithographically patterned to form at least one opening within the area of the first device region 101. An anisotropic etch process may be performed using the patterned photoresist layer to form vertically-extending trenches 69. The vertically extending trenches 69 may vertically extend through the etch stop dielectric material layer 30 and into at least one of the interconnect-level dielectric material layers 20. Each vertically-extending trench 69 may have a bottom surface within one of the interconnect-level dielectric material layers 20. Alternatively, each vertically-extending trench 69 may extend into the MEMS substrate 50 (through shallow trench isolation structures 52), and have a bottom surface within the MEMS substrate 50. The at least one vertically-extending trench 69 may include a plurality of vertically-extending trenches. While FIG. 1F depict two vertically extending trenches 69 for illustrative purposes, additional vertically extending trenches 69 are contemplated within the scope of this disclosure.

Each vertically-extending trench 69 can have a respective width w at a topmost portion, i.e., at a periphery that adjoins the top surface of the etch stop dielectric material layer 30. The width w can be measured between top edges of opposing segments of the sidewalls for each vertically-extending trench 69 that face each other. The width w may be uniform throughout a vertically-extending trench 69, for example, for a vertically-extending trench 69 having a rectangular opening or for a vertically-extending trench having an inner sidewall and an outer sidewall located on a respective arc of two concentric circles having different radii. Alternatively, one or more of the at least one vertically-extending trench 69 can have a width modulation. For example, the maximum width of a vertically-extending trench 69 having a width modulation may be the width w, and the vertically-extending trench 69 can include at least one region having a lesser width than the width w.

Further, each vertically-extending trench 69 can have a respective depth d between a top periphery and a bottom surface. For each vertically-extending trench 69, the depth d can be at least twice the width w. In one embodiment, the aspect ratio of each vertically-extending trench 69, i.e., the ratio of the depth d to the width w, can be in a range from 2 to 40 (i.e., the depth d twice the width w to the depth d being 40 times the width w), such as from 3 to 10. In one embodiment, each vertically-extending trench 69 can have straight sidewalls. In such an embodiment, the straight sidewalls of each vertically-extending trench 69 may be vertical, or may have a taper angle greater than 0 degree and less than 45 degrees, such as between 0 degree and 10 degrees. Alternatively, the sidewalls of the vertically-extending trench 69 may be convex or concave with a generally decreasing width with an increasing distance from the horizontal plane including the top surface of the etch stop dielectric material layer 30. In a non-limiting illustrative example, each vertically-extending trench 69 can have a width w in a range from 150 nm to 5,000 nm, and a depth in a range from 300 nm to 10,000 nm, although lesser and greater dimensions can also be used. The aspect ratio of each vertically-extending trench 69 can be in a range from 1.0 to 60, such as from 1.5 to 10.

Referring to FIG. 1G, an outgassing-material-containing layer 62L may be deposited in each vertically-extending trench 69 and over the top surface of the etch stop dielectric material layer 30. The outgassing-material-containing layer 62L includes at least one continuous layer that contains an outgassing material that is herein referred to as at least one continuous outgassing material layer. The outgassing-material-containing layer 62L may consist of the at least one continuous outgassing material layer in some embodiments, or may include at least one additional material layer in some other embodiments to be subsequently described. In one embodiment, the outgassing-material-containing layer 62L may consist of a single continuous outgassing material layer or a stack of multiple continuous outgassing material layers.

Each continuous outgassing material layer within the outgassing-material-containing layer 62L includes an outgassing material that is capable of outgassing at a temperature above room temperature. In an illustrative example, the outgassing-material-containing layer 62L can include a continuous outgassing material layer contacting a silicon oxide material deposited using a silicon oxide deposition process that subsequently outgasses. Various types of silicon oxide materials can be deposited employing such deposition processes as sputtering (physical vapor deposition), plasma-enhanced chemical vapor deposition, high density plasma chemical vapor deposition, and thermal silicon oxide deposition. The lateral thickness t of each vertical portion of the outgas sing-material-containing layer 62L at an opening of a respective vertically-extending trench 69 is less than one half of the width w of the respective vertically-extending trench 69. For example, the lateral thickness t of each vertical portion of the outgas sing-material-containing layer 62L can be in a range from 50 nm to 2,500 nm, although lesser and greater lateral thicknesses can also be used. Generally, the lateral thickness t of each vertical portion of the outgassing-material-containing layer 62L is thick enough to contain a significant amount of the outgassing material (e.g., by being greater than 50 nm), and is thin enough to enable deposition by commercially available film deposition techniques such as chemical vapor deposition (e.g., by being less than 2,500 nm). A vertically-extending cavity 69' is present within a center region of each vertically-extending trench 69. Thus, each vertically-extending portion of the outgassing-material-containing layer 62L can be physically exposed to a respective vertically-extending trench 69. Each physically exposed surface of a vertically-extending portion of the outgassing-material-containing layer 62L can include a vertically-extending surface, i.e., a surface that extends along a vertical direction, and may have a straight sidewall, a concave sidewall, or a convex sidewall. If a physically exposed surface of a vertically-extending portion of the outgassing-material-containing layer 62L has a straight sidewall, the straight sidewall may be vertical or tapered.

The gas content and the outgassing rate of the silicon oxide material can be adjusted by changing parameters of the deposition process such as chamber pressure, gas flow rates, and radio-frequency (RF) power. Alternatively, the outgassing-material-containing layer 62L can be composited of any material capable of outgassing, such as, but not limited to, polyimide, poly (para-xylylene) derivatives, and other organic compounds. In one embodiment, the outgassing-material-containing layer 62L may comprise, and/or may consist of, a plurality of material layers in which at least one material layer is capable of outgassing.

Deposition processes for depositing the outgassing-material-containing layer 62L include, but are not limited to, plasma-enhanced chemical vapor deposition (PECVD), high density plasma chemical vapor deposition (HDPCVD), low pressure chemical vapor deposition (LPCVD), magnetron sputtering, thermal evaporation, e-beam evaporation, and atomic layer deposition (ALD).

Figure 1H:
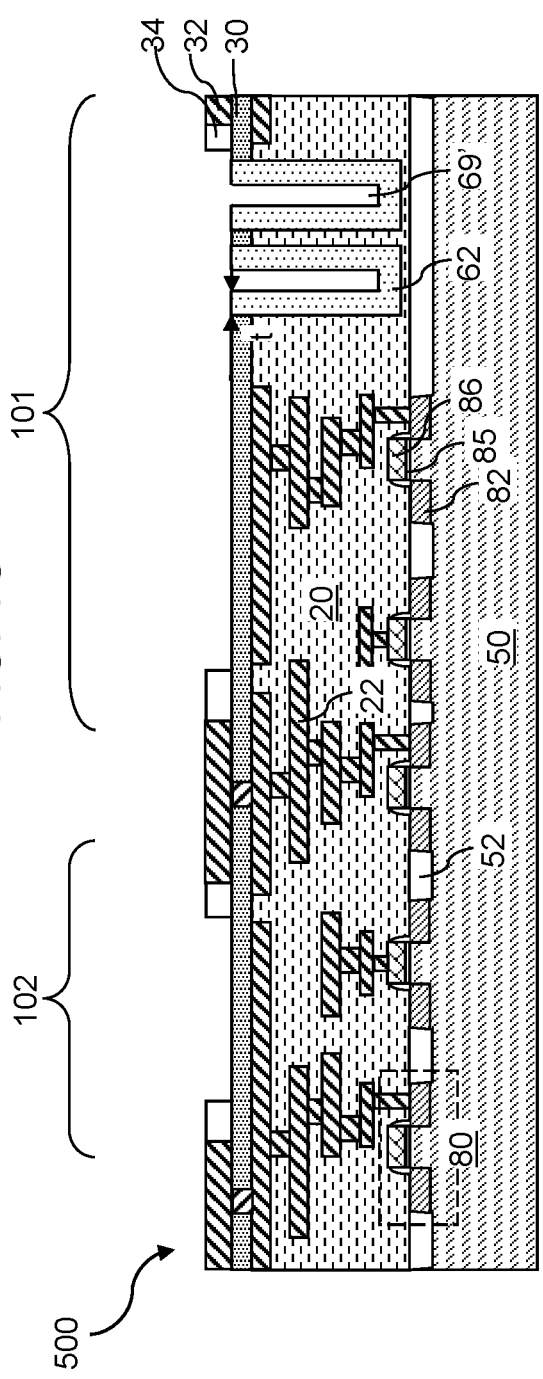
FIG. 1H is a vertical cross-sectional view of the MEMS support structure after removal of a horizontally-extending portion of the outgas sing-material-containing layer in accordance with the first embodiment of the present disclosure.

Referring to FIG. 1H, the horizontal portion of the outgassing-material-containing layer 62L that overlies the horizontal surface including the top surface of the etch stop dielectric material layer 30 may be removed by a planarization process. For example, an anisotropic etch process may be performed to remove the horizontal portion of the outgassing-material-containing layer 62L that overlies the horizontal surface including the top surface of the etch stop dielectric material layer 30. Optionally, a patterned photoresist layer (not shown) may be employed to cover the areas including the vertically-extending trenches 69 during the anisotropic etch process. The photoresist layer may be subsequently removed, for example, by ashing. Each remaining portion of the outgas sing-material-containing layer 62L located within a respective vertically-extending trench 69 constitutes an outgassing-material-containing portion 62.

Generally, a horizontal portion of a continuous outgas sing material layer within the outgassing-material-containing layer 62L may be removed outside the region including the at least one vertically-extending trench 69. The horizontal portion of a continuous outgassing material layer within the outgassing-material-containing layer 62L can be removed by an anisotropic etch process that does not use any etch mask layer, or an anisotropic etch process that uses a patterned photoresist layer that covers the region including the at least one vertically-extending trench 69. In one embodiment, the outgassing-material-containing layer 62L may be entirely removed from above the horizontal plane including the top surface of the etch stop dielectric material layer 30, or only outside the area that is not covered by the patterned photoresist layer. If a patterned photoresist layer is used, the patterned photoresist layer can continuously extend over the entire area of the at least one vertically-extending trench 69.

Each outgassing-material-containing portion 62 can include a vertically-extending outgassing material portion having a vertically-extending surface. Each vertically-extending surface of the outgassing-material-containing portions 62 may have a straight sidewall, a concave sidewall, or a convex sidewall. If an outgassing-material-containing portion 62 has a straight sidewall, the straight sidewall may be vertical or tapered. Each vertically-extending surface of the vertically-extending outgassing material portion can be physically exposed to, and thus, can be in contact with, a respective vertically-extending cavity 69' that is located in a respective vertically-extending trench 69.

An upper periphery of each vertically-extending outer sidewall of the outgassing-material-containing portion 62 can be adjoined to a same horizontal surface, which is herein referred to as a horizontal reference surface. In one embodiment, the horizontal reference surface can be a top horizontal surface of the etch stop dielectric material layer 30. In one embodiment, each vertically-extending outgassing material portion of the outgas sing-material-containing portion 62 can have a vertical extent that is greater than a lateral dimension, such as the width w, of the respective one of the at least one vertically-extending trench 69 at a level of the reference horizontal plane. In one embodiment, each vertically-extending outgassing material portion of the outgassing-material-containing portion 62 can have a lateral thickness t that is less than one half of the lateral dimension, such as the width w, of the respective one of the at least one vertically-extending trench 69.

Referring to FIG. 1I, a matrix material layer 10L may be provided. The matrix material layer 10L may include a semiconductor material, which may be silicon, germanium, a silicon-germanium alloy, a compound semiconductor material that can be doped to locally alter electrical conductivity, or any other semiconductor material. In one embodiment, the matrix material layer 10L may have a thickness in a range from 30 microns to 1 mm, although lesser and greater thicknesses can also be used. In one embodiment, the matrix material layer 10L may include a hydrogen-implanted layer to provide subsequent cleaving of the matrix material layer 10L. In such an embodiment, the depth of the hydrogen-implanted layer from a major surface of the matrix material layer 10L may be in a range from 100 nm to 3 microns, such as from 300 nm to 1,000 nm, although lesser and greater depths can also be used.

The matrix material layer 10L may be attached to the MEMS support structure 500. In one embodiment, the matrix material layer 10L may be bonded to the bonding-level dielectric material layer 34 of the MEMS support structure 500, for example, by oxide-to-semiconductor bonding. For example, the matrix material layer 10L may be pressed against the top surface of the bonding-level dielectric material layer 34, and may be annealed at a temperature in a range from 150 degrees Celsius to 400 degrees Celsius to induce bonding between the bonding-level dielectric material layer 34 and the matrix material layer 10L. A bonded assembly of a MEMS support structure 500 and the matrix material layer 10L may be formed. Laterally-extending cavities 39 may be formed between the etch stop dielectric material layer 30 and the matrix material layer 10L. Each of the vertically-extending cavities 69' may be connected to a respective one of the laterally-extending cavities 39.

Referring to FIG. 1J, the matrix material layer 10L may be thinned to provide a thinned matrix material layer 10T. The thickness of the thinned matrix material layer 10T may be in a range from 100 nm to 50 microns, such as from 2 microns to 20 microns, although lesser and greater thicknesses can also be used. In one embodiment, the thinning of the matrix material layer 10L may be performed by grinding, polishing, an isotropic etch process, an anisotropic etch process, or a combination thereof. In embodiments in which a hydrogen-implanted layer may be provided within the matrix material layer 10L, a cleaving process may be used to remove distal portions of the matrix material layer 10L that are more distal from the MEMS substrate 50 than the hydrogen-implanted layer. In embodiments in which a cleaving process is employed, an anneal at an elevated process in a range from 400 degrees Celsius to 600 degrees Celsius may be performed for the cleaving process to induce bubbling of hydrogen atoms at the level of the hydrogen-implanted layer within the matrix material layer 10L. Generally, a matrix material layer including a semiconductor material, such as the thinned matrix material layer 10T, can be formed over the MEMS support structure 500.

Figure 1K:
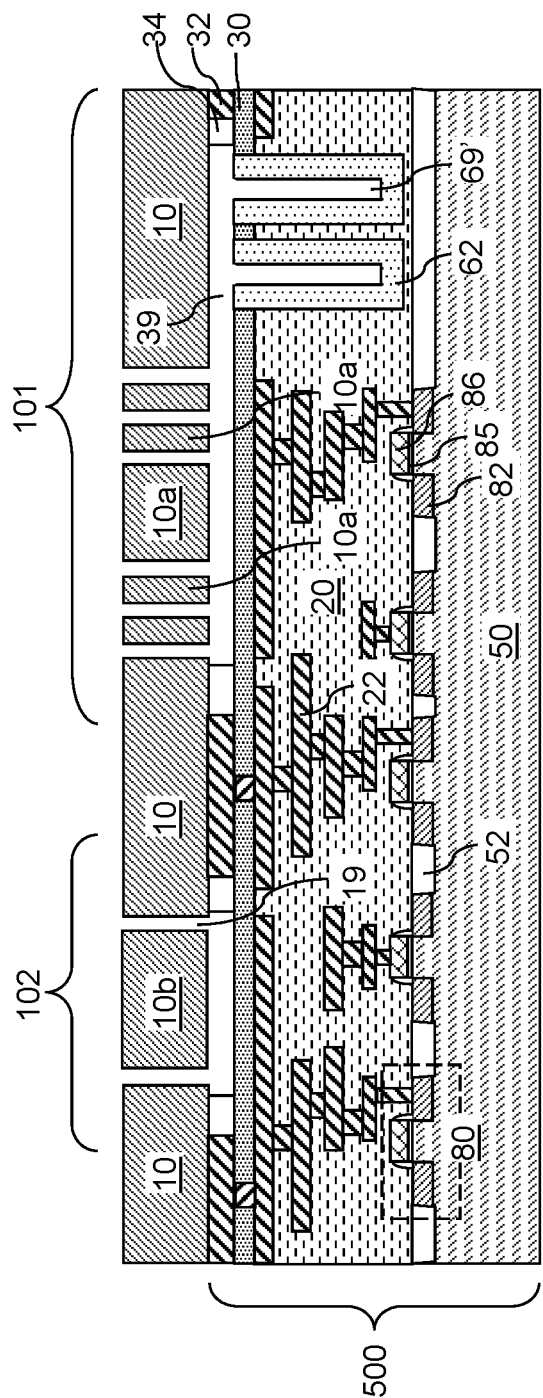
FIG. 1K is a vertical cross-sectional view of the exemplary structure after patterning the matrix material layer into movable elements and a matrix layer in accordance with the first embodiment of the present disclosure.

Referring to FIG. 1K, a photoresist layer (not shown) may be applied over the thinned matrix material layer 10T, and may be lithographically patterned to form openings in areas that define gaps 19 between movable elements and a matrix layer to be subsequently patterned from the thinned matrix material layer 10T. In other words, the pattern of the openings in the photoresist layer may include the pattern of the gaps 19 between the movable elements and the matrix layer to be subsequently patterned from the thinned matrix material layer 10T.

An anisotropic etch process may be performed to transfer the pattern of the opening in the photoresist layer through the thinned matrix material layer 10T. The thinned matrix material layer 10T may be divided into multiple portions, which include movable elements (10a, 10b) and a matrix layer 10 that laterally surrounds each of the movable elements (10a, 10b). Generally, the movable elements (10a, 10b) may include any element that is capable of bending, vibrating, deforming, displacement, rotating, twisting, and any other type of change in shape, position, and/or orientation. In an illustrative example, the movable elements (10a, 10b) may include a first movable element 10a formed in the first device region 101 and a second movable element 10b formed in the second device region 102. For example, the first movable element 10a may be used for an accelerometer, and the second movable element 10b may be used for a gyroscope. Generally, a first movable element 10a may be configured to operate at higher ambient pressure than the second movable element 10b. In other words, the optimal operating pressure for the MEMS device including the first movable element 10a may be higher than the optimal operating pressure for the MEMS device including the second movable element 10b.

According to an aspect of the present disclosure, the vertically-extending trenches 69 and the outgassing-material-containing portions 62 may be formed only in the area of the first device region 101, and not formed in the area of the second device region 102. According to another aspect of the present disclosure, the vertically-extending trenches 69 and the outgassing-material-containing portions 62 may be formed in the area of the first device region 101 at a higher areal density than in the area of the second device region 102.

Additional movable elements (not shown) may be patterned out of the thinned matrix material layer 10T. A continuous remaining portion of the thinned matrix material layer 10T that laterally surrounds each of the movable elements (10a, 10b) constitutes a stationary portion of MEMS devices against which relative movement of the movable elements (10a, 10b) may be measured. The stationary remaining portion of the MEMS devices is herein referred to as a matrix layer 10. The movable elements (10a, 10b) and the matrix layer 10 may include a same material. In one embodiment, the movable elements (10a, 10b) and the matrix layer 10 may include a same semiconductor material, which is herein referred to as the first semiconductor material. A subset and/or portions of the movable elements (10a, 10b) may be doped with p-type dopants and/or n-type dopants as needed. Gaps 19 extending down to the laterally-extending cavities 39 may be formed between the matrix layer 10 and the various movable elements (10a, 10b).

The movable elements (10a, 10b) may be detached from the matrix layer 10 by the gaps 19. A MEMS assembly is provided, which may include the MEMS support structure 500, the matrix layer 10, and at least one movable element (10a, 10b) laterally confined by the matrix layer 10. The MEMS support structure 500 includes the MEMS substrate 50, interconnect-level dielectric material layers 20 located between the MEMS substrate 50 and the matrix layer 10 and having metal interconnect structures 22 formed within the dielectric material layer 20, an etch stop dielectric material layer 30, a bonding-level dielectric material layer 34, bonding-level metal interconnect structures 32, and outgassing-material-containing portions 62 located within vertically-extending trenches 69. Generally, at least one movable element (10a, 10b) may be laterally confined within the matrix layer 10 that overlies the MEMS support structure 500. Outgassing-material-containing portions 62 may be formed in the MEMS support structure 500 between the matrix layer 10 and the MEMS substrate 50. The structure illustrated in FIG. 1K includes a MEMS assembly, which can be subsequently bonded to a cap structure to form a MEMS device.

Figure 2A:
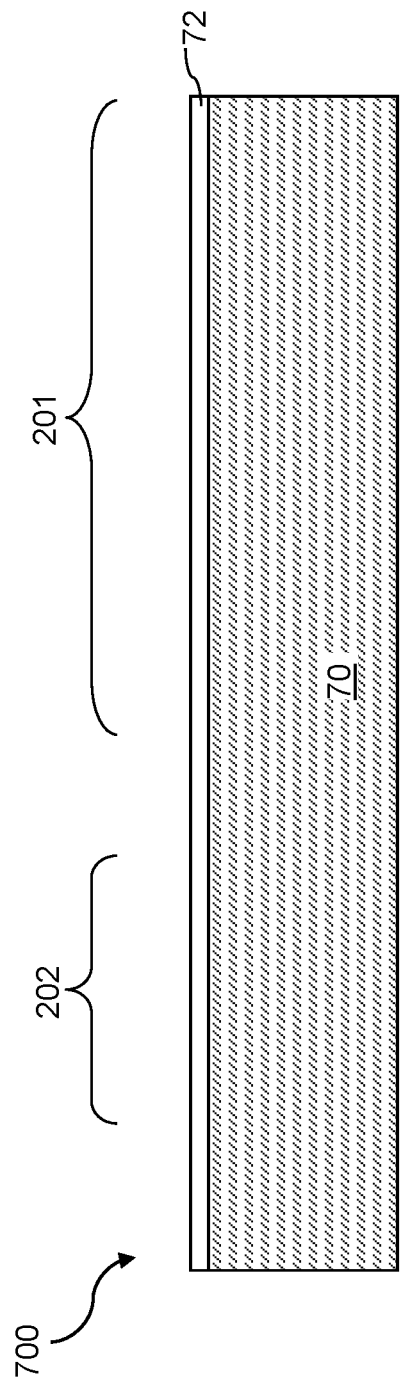
FIG. 2A is a vertical cross-sectional view of an exemplary structure for forming a cap structure after formation of a bonding material layer in accordance with the first embodiment of the present disclosure.

Referring to FIG. 2A, a cap structure 700 is illustrated, which can be subsequently bonded to the matrix layer 10 of FIG. 1K upon further patterning. The cap structure 700 includes a substrate, which is herein referred to as a cap substrate 70. The cap substrate 70 may include a semiconductor material, an insulating material, and/or a conductive material. In one embodiment, the cap substrate 70 may include a semiconductor material, which is herein referred to as a second semiconductor material. For example, the cap substrate 70 may include a silicon substrate. The thickness of the cap substrate 70 may be in a range from 60 microns to 1 mm, although lesser and greater thicknesses can also be used. Optionally, complementary metal-oxide-semiconductor (CMOS) devices such as field effect transistors (not shown) can be provided on the backside of the cap structure 700.

The cap structure 700 may have multiple device regions arranged in a mirror image pattern of the pattern of the various device regions (101, 102) of the MEMS assembly illustrated in FIG. 1K. For example, the cap structure 700 may include a first device region 201, a second device region 202, and optional additional device regions (not illustrated). The first device region 201 of the cap structure 700 may have a mirror image shape of the first device region 101 of the MEMS assembly of FIG. 1K, and the second device region 202 of the cap structure 700 can have a mirror image shape of the second device region 102 of the second device region 102 of the MEMS assembly of FIG. 1K.

A bonding material may be deposited on the top side of the cap substrate 70 to form a bonding material layer 72. The bonding material of the bonding material layer 72 can include any material that can bond with the semiconductor material of the matrix layer 10. For example, the bonding material layer 72 can include silicon oxide that can form silicon-silicon oxide bonding with the semiconductor material of the matrix layer 10, a metallic material such as aluminum, an aluminum-silicon alloy, or an aluminum-germanium alloy that can form eutectic bonding with the semiconductor material of the matrix layer 10, or any other adhesive material that can form a vacuum-tight seal with the semiconductor material of the matrix layer 10. Alternatively, a surface portion of the thinned matrix material layer 10T may be oxidized by a plasma oxidation process after the processing steps of FIG. 1J and prior to the processing steps of FIG. 1K to provide silicon oxide surface portions on top of each of the movable elements (10a, 10b) and on top of the matrix layer 10, and the bonding material layer 72 can include silicon oxide that is subsequently used for silicon oxide-silicon oxide bonding with the silicon oxide surface layer overlying the matrix layer 10.

In one embodiment, the bonding material layer 72 may include silicon oxide and may have a thickness in a range from 30 nm to 300 nm, although lesser and greater thicknesses can also be used. The bonding material layer 72 may be conformally or non-conformally deposited. For example, the bonding material layer 72 may include undoped silicate glass formed by decomposition of tetraethylorthosilicate. In another embodiment, the bonding material layer 72 can include aluminum, an aluminum-silicon alloy, or an aluminum-germanium alloy having a thickness in a range from 20 nm to 200 nm, although lesser and greater thicknesses can also be used.

Figure 2B:
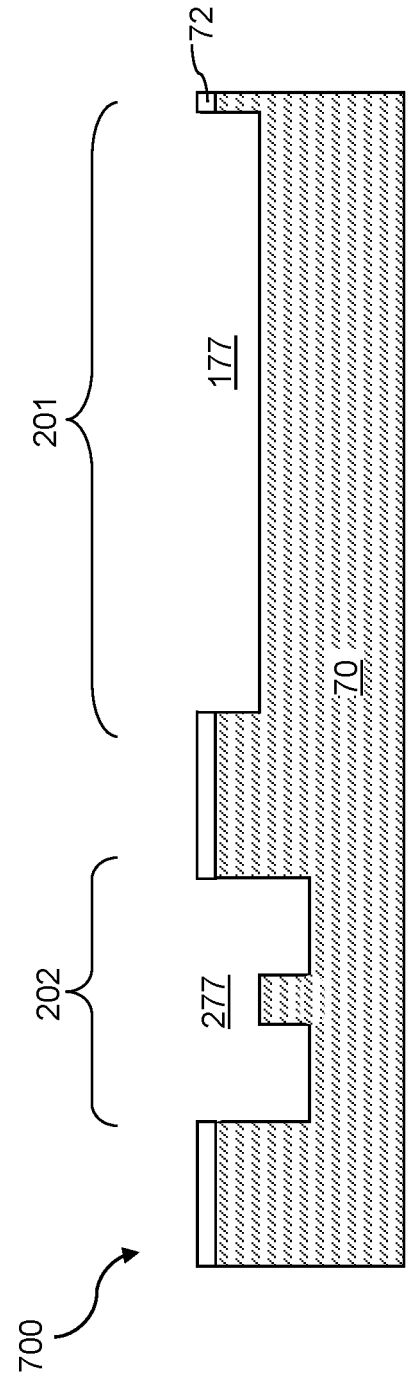
FIG. 2B is a vertical cross-sectional view of a cap structure after formation of capping surfaces in accordance with the first embodiment of the present disclosure.

Referring to FIG. 2B, the top surface of the cap structure 700 can be patterned using at least one combination of a lithographic patterning process and an etch process. In each lithographic patterning process, a photoresist layer is applied over a top surface of the cap structure 700, and is lithographically exposed and developed to form a patterned photoresist layer that functions as an etch mask layer. In each etch process, unmasked surface portions of the cap structure 700 are removed using the patterned photoresist layer as an etch mask layer. The etch process can include an isotropic etch process (such as a wet etch process) or an anisotropic etch process (such as a reactive ion etch process). The duration of the etch process can be selected to control the depth of the recesses formed by the etch process. The photoresist layer can be removed after the etch process, for example, by ashing.

A first recess region 177 having a first recessed surface can be formed in the first device region 201, and a second recess region 277 having a second recessed surface can be formed in the second device region 202. The first recessed surface is subsequently used as a first capping surface for the first movable element 10a, and the second recessed surface is subsequently used as a second capping surface for the second movable element 10b. Multiple combination of a lithographic patterning process and an etch process can be performed to provide various recessed surfaces having different depth across various device regions. For example, a recessed surface in the first device region 201 may have a different recess depth than a recessed surface in the second device region 202. Further, at least one of the recessed surfaces may have steps to provide a pattern in a respective recessed surface. The pattern and the depth of each recessed surface can be optimized for each MEMS device to be formed in the various device regions. The depths of the recessed surfaces, as measured from the top surface of the bonding material layer 72, may be in a range from 50 nm to 50 microns, although lesser and greater depths can also be used.

Figure 3:
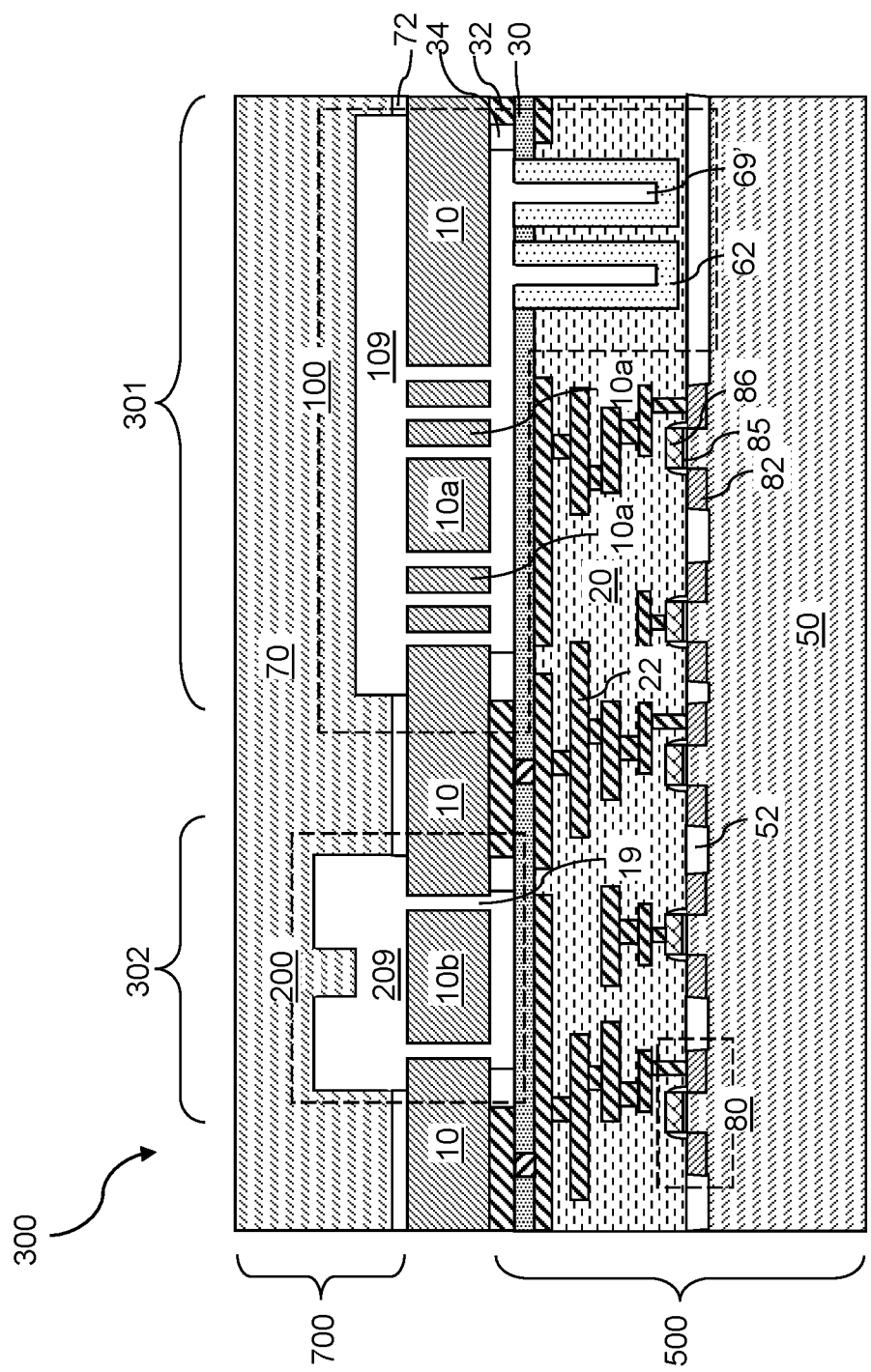
FIG. 3 is a vertical cross-sectional view of a first exemplary micro-electro mechanical system (MEMS) device in accordance with the first embodiment of the present disclosure.

Referring to FIG. 3, the cap structure 700 of FIG. 2B may be bonded to the MEMS assembly of FIG. 1K to form an exemplary micro-electro mechanical system (MEMS) device 300, which is herein referred to as first exemplary MEMS device 300. The first exemplary MEMS device 300 may have a first device region 301 and second device region 302. In this illustrated embodiment, the cap structure 700 may be bonded to the matrix layer 10 such that the front side (i.e., the upside as illustrated in FIG. 2B) of the cap structure 700 faces the matrix layer 10 (effectively flipping the cap structure 700 illustrated in FIG. 2B upside down). In one embodiment, the bonding of the cap structure 700 to the matrix layer 10 may be achieved by bonding the matrix layer 10 to the bonding material layer 72. Depending on the material composition of the bonding material layer 72, the bonding may use silicon to silicon oxide bonding, eutectic bonding between a metal and the semiconductor material of the matrix layer 10, or silicon oxide to silicon oxide bonding (in which case a silicon oxide layer is provided on the top surface of the matrix layer 10 and is bonded to the silicon oxide material of the bonding material layer 72).

A first sealed chamber 109 including a first movable element 10a may be formed by aligning the first recess region of the cap structure 700 over the first movable element 10a during bonding the cap structure 700 to the matrix layer 10. The first sealed chamber 109 includes a first head volume that overlies the first movable element 10a, and the second sealed chamber 209 includes a second head volume that overlies the second movable element 10b. The first sealed chamber 109 may be laterally bounded by the matrix layer 10 and may be vertically bounded by the first capping surface that overlies the first movable element 10a. A first MEMS device 100 includes the first movable element 10a, the first sealed chamber 109, and the first capping surface. The first MEMS device 100 may form an accelerometer.

A second sealed chamber 209 including a second movable element 10b may be formed by aligning the second recess region of the cap structure 700 over the second movable element 10b during bonding the cap structure 700 to the matrix layer 10. The second sealed chamber 209 may include a second head volume that overlies the second movable element 10b. The second sealed chamber 209 may be vertically bounded by a second capping surface that overlies the second movable element 10b. The second capping surface can comprise the planar horizontal surface of the cap structure 700 located within the second recess region. The second sealed chamber 209 may be vertically bounded by the second capping surface that overlies the second movable element 10b. A second MEMS device 200 includes the second movable element 10b, the second sealed chamber 209, and the second capping surface. The MEMS device of the present disclosure can be a composite MEMS device including the first MEMS device 100 (which can include an accelerometer) and the second MEMS device 200 (which can include a gyroscope).

In one embodiment, the first sealed chamber 109 can be bounded by a horizontal capping surface of the portion of the cap structure 700 that faces the matrix layer 10. Each vertically-extending outgas sing material portion of the outgas sing-material-containing portions 62 can have a surface that is physically exposed to the first sealed chamber 109. At least one vertically-extending trench 69 extends into the interconnect-level dielectric material layers 20, and includes a respective vertically-extending outgassing material portion having a surface in contact with (and thus, physically exposed to) a respective vertically-extending cavity 69'. Each vertically-extending cavity 69' can be a portion of the first sealed chamber 109. In one embodiment, each vertically-extending outgassing material portion can have a surface that is physically exposed to the first sealed chamber 109. By including the at least one vertically-extending trench 69 with outgassing-material-containing portions 62 formed on the sides in the first sealed chamber 109, but not in the second sealed chamber 209, different pressures in each of the chambers 109, 209 may be achieved.

In one embodiment, the interconnect-level dielectric material layers 20 may be disposed between the MEMS substrate 50 and the matrix layer 10. Metal interconnect structures (22, 32) can be formed in the interconnect-level dielectric material layers 20 and in the bonding-level dielectric material layer 34. In one embodiment, the at least one vertically-extending trench 69 extends through at least one of the interconnect-level dielectric material layers 20. In one embodiment, each vertically-extending outgassing material portion is located entirely within a volume of a respective one of the at least one vertically-extending trench 69.

In one embodiment, a CMOS circuit that controls each of the first MEMS device 100 and the second MEMS device 200 can be provided among the semiconductor devices 80 on the MEMS substrate 50. Alternatively, or additionally, semiconductor devices that controls one of more of the MEMS devices (100, 200) may be provided in, or on, the cap structure 70.

Figure 4:
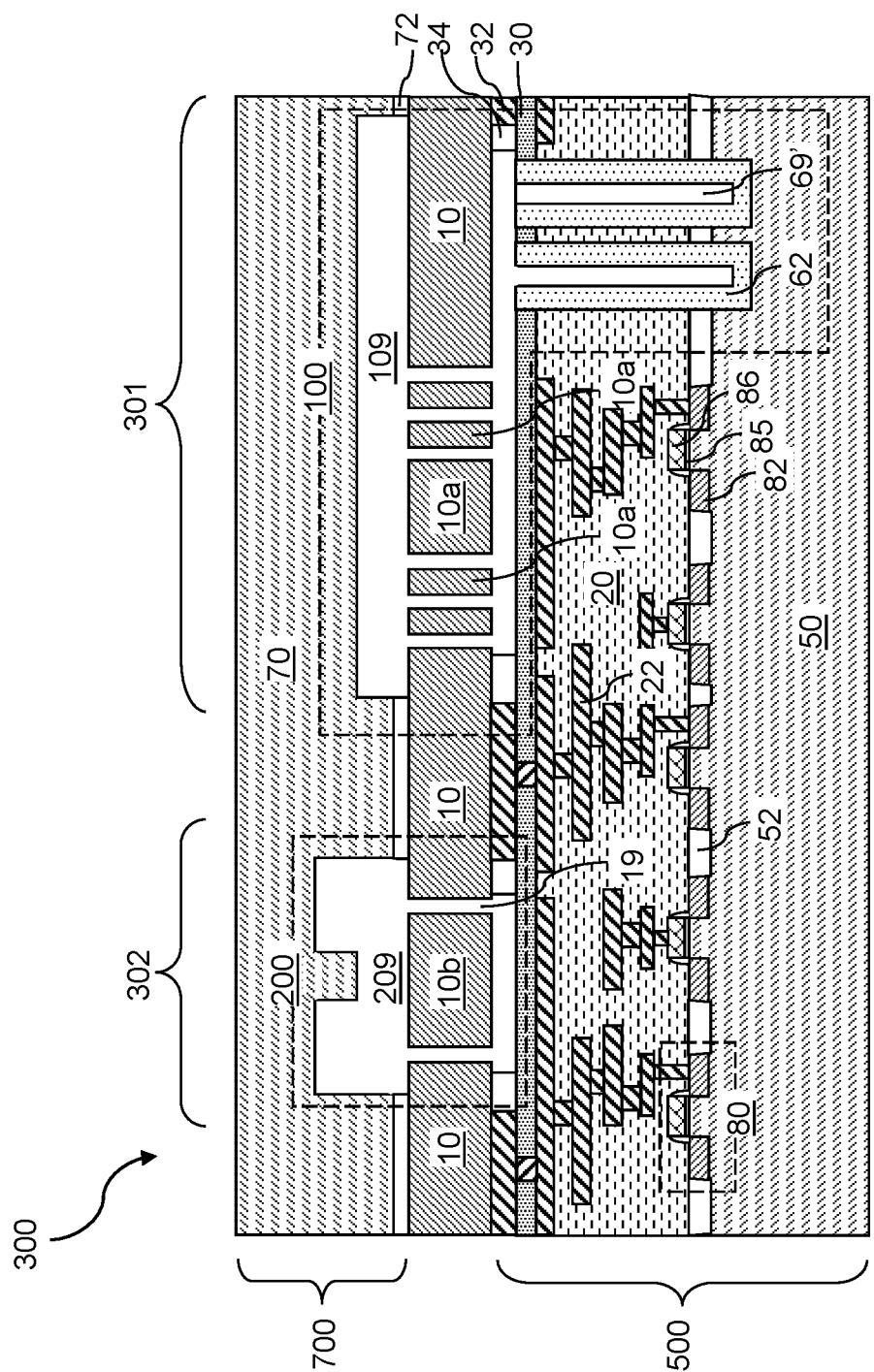
FIG. 4 is a vertical cross-sectional view of a second exemplary MEMS device in accordance with a second embodiment of the present disclosure.

Referring to FIG. 4, a second exemplary MEMS device 300 in accordance with a second embodiment of the present disclosure is illustrated. The second exemplary MEMS device can be derived from the first exemplary MEMS device of FIG. 4 by modifying the depth d of the at least one vertically-extending trench 69, and thus, the vertical extent of each outgassing-material-containing portion 62. Specifically, the anisotropic etch process that forms the at least one vertically-extending trench 69 can be modified so that the at least one vertically-extending trench 69 vertically extends through each of the interconnect-level dielectric material layers 20 and into an upper portion of the MEMS substrate 50. Each vertically-extending outgassing material portion of the outgas sing-material-containing portion 62 can be located entirely within a volume of a respective one of the at least one vertically-extending trench 69. In one embodiment, each outgassing-material-containing portion 62 in a vertically-extending trench 69 can be formed as a single continuous material portion without any hole therethrough.

Figure 5:
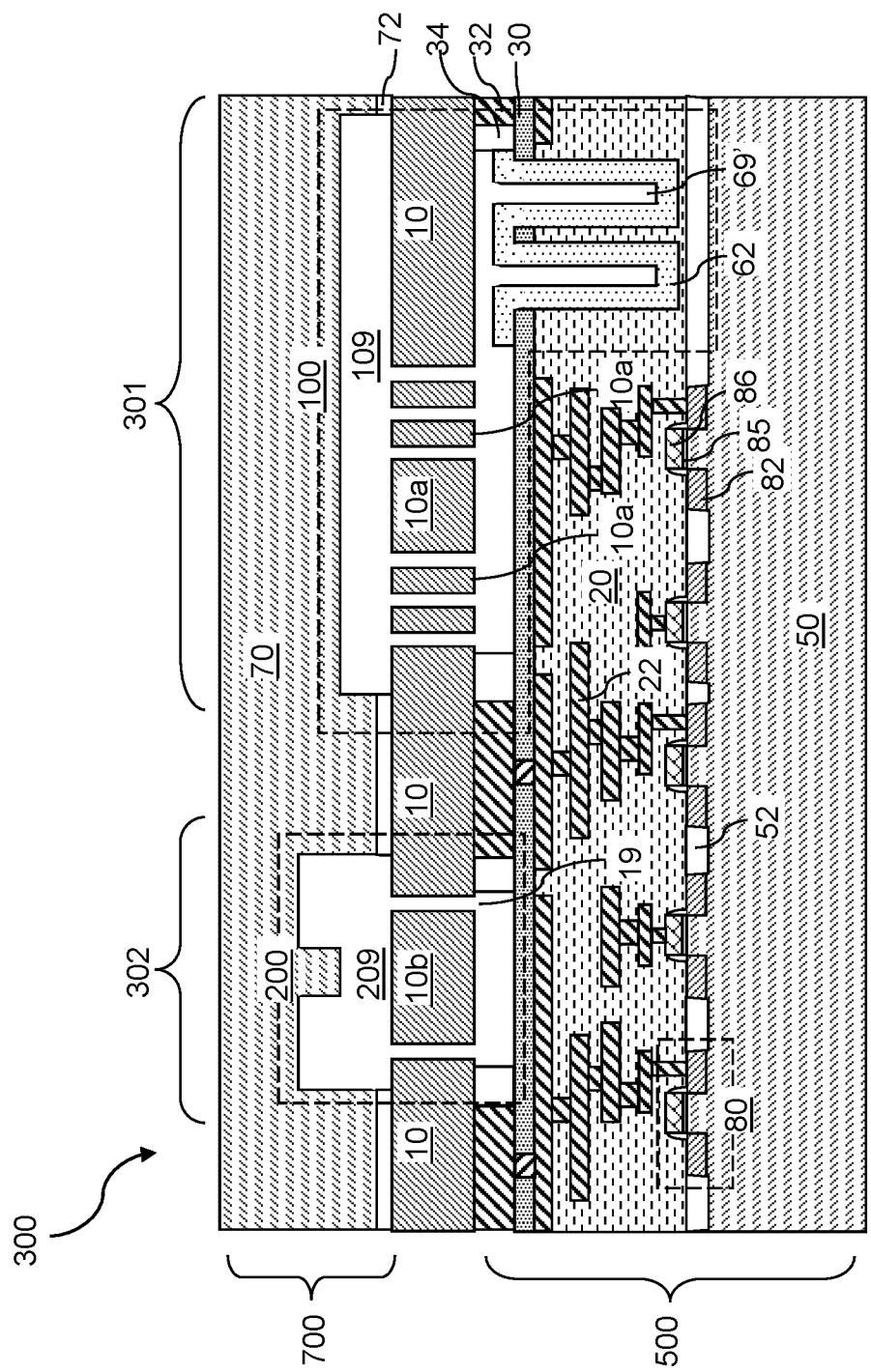
FIG. 5 is a vertical cross-sectional view of a third exemplary MEMS device in accordance with a third embodiment of the present disclosure.

Referring to FIG. 5, a third exemplary MEMS device 300 in accordance with a third embodiment of the present disclosure is illustrated. The third exemplary MEMS device 300 of the present disclosure can be derived from the first exemplary MEMS device 300 or the second exemplary MEMS device of the present disclosure by patterning the outgassing-material-containing layer 62L using a combination of a lithographic patterning process and a pattern transfer process including an etch process at the processing steps of FIG. 1H. Specifically, a photoresist layer can be applied over the outgassing-material-containing layer 62L, and can be lithographically patterned to remove horizontal portions of the outgas sing-material-containing layer 62L located outside the region including the at least one vertically-extending trench 69. The remaining portion of the photoresist layer can extend over, and can cover each of, the at least one vertically-extending trench 69. The area covered by the patterned photoresist layer can be entirely within the area of the first device region 101. Portions of the outgassing-material-containing layer 62L that are not covered by the patterned photoresist layer may be removed by an etch process that etches the material of the outgas sing-material-containing layer 62L selective to the material of the thinned matrix material layer 10T. The photoresist layer can be removed, for example, by ashing. The outgassing-material-containing portion 62 can be formed as a single contiguous material portion without any hole therethrough. If a plurality of vertically-extending trenches 69 are present, the outgas sing-material-containing portion 62 can include a plurality of vertically-extending outgassing material portions that are adjoined to a horizontally-extending outgas sing material portion that contacts a horizontal surface (i.e., a top surface) of the etch stop dielectric material layer 30. The at least one vertically-extending outgassing material portion of the third exemplary MEMS device 300 can include a portion of an outgassing-material-containing layer 62 that includes a horizontally-extending portion contacting a horizontal surface of the etch stop dielectric material layer 30. In an alternative embodiment in which the at least one outgassing-material-containing portion 62 may be formed in the cap structure 700, the at least one vertically-extending outgassing material portion of the third exemplary MEMS device 300 can include a horizontally-extending portion contacting a horizontal surface of the portion of the cap structure 700 that faces the matrix layer 10.

Figure 6A:
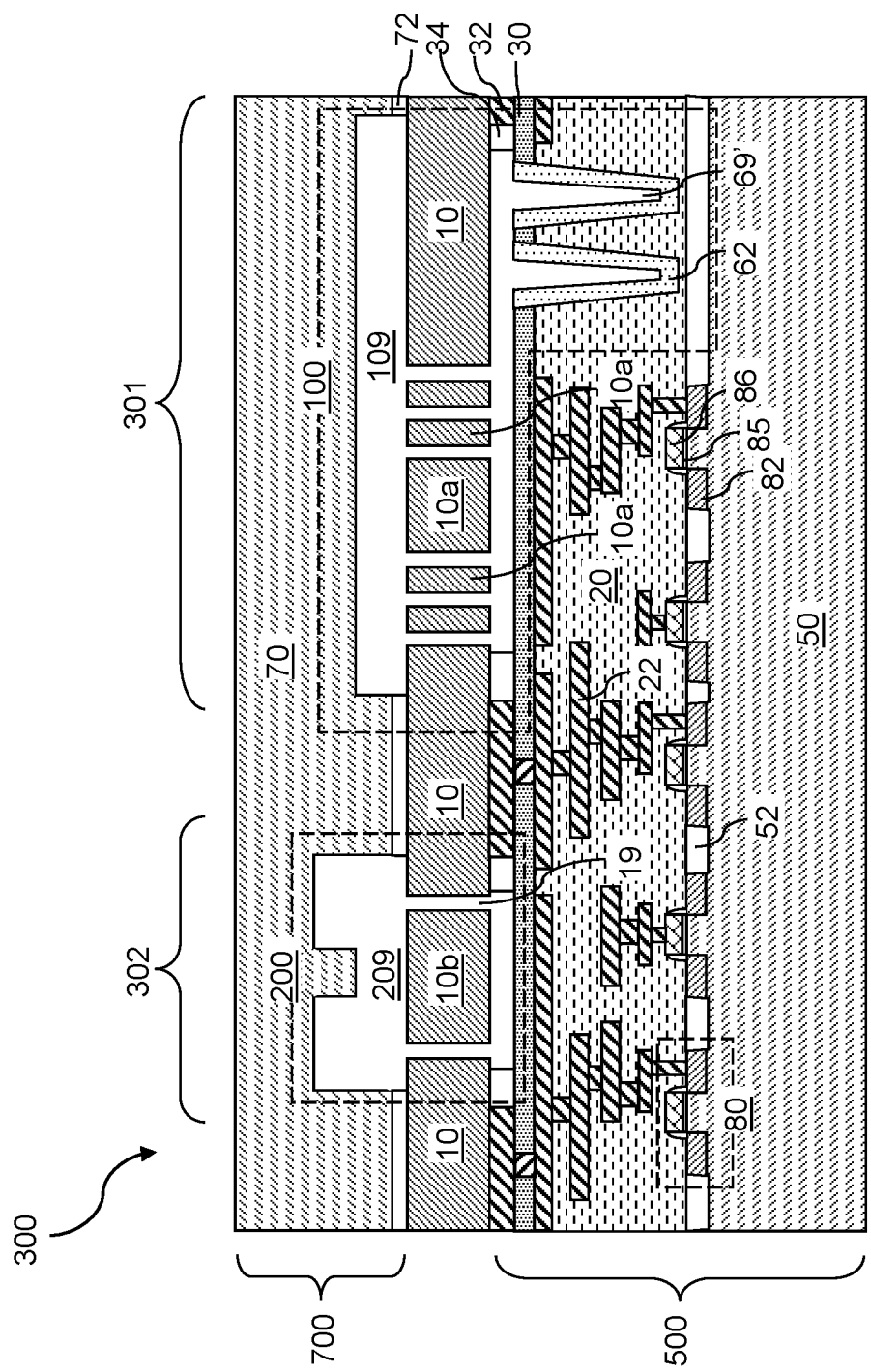
FIG. 6A is a vertical cross-sectional view of a first exemplary configuration of a fourth exemplary MEMS device in accordance with a fourth embodiment of the present disclosure.
Figure 6B:
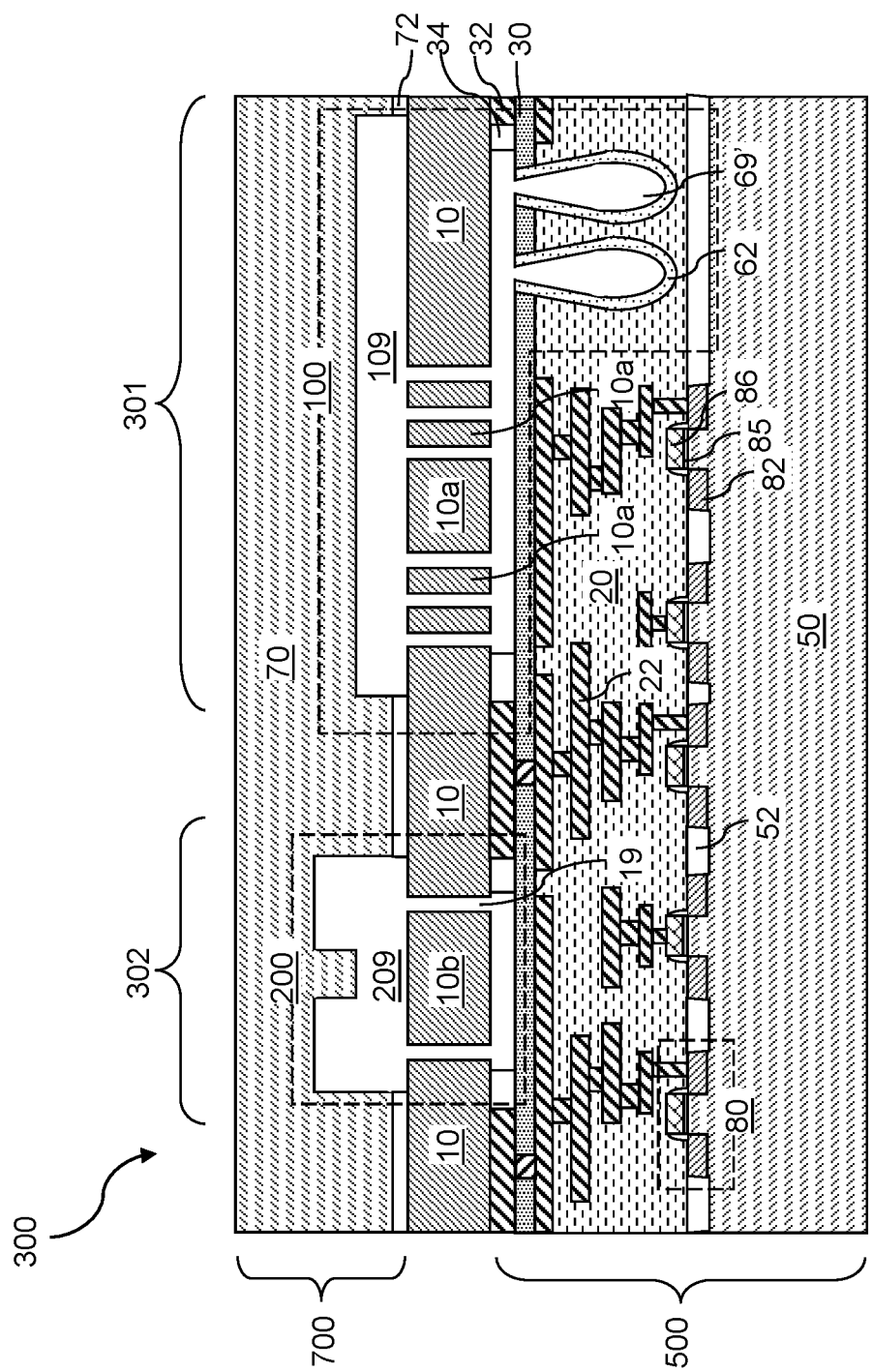
FIG. 6B is a vertical cross-sectional view of a second exemplary configuration of a fourth exemplary MEMS device in accordance with the fourth embodiment of the present disclosure.

Referring to FIGS. 6A and 6B, configurations of a fourth exemplary MEMS device in accordance with a fourth embodiment of the present disclosure are illustrated. In such an embodiment, the sidewalls of each vertically-extending trench 69 can include at least one tapered surface as illustrated in FIG. 6A, and/or at least one retro-tapered and/or concave surface as illustrated in FIG. 6B. A tapered surface of a vertically-extending trench 69 can be formed by performing an anisotropic etch process that induces polymerization of a photoresist material in a patterned photoresist layer and coating of sidewalls of the vertically-extending trenches 69 under formation by the polymerized photoresist material during the anisotropic etch process at the processing step of 1G. In an embodiment, the configuration illustrated in FIG. 6A can be provided. Alternatively, a vertically-extending trench 69 including retro-tapered surfaces and/or having a bottle shape can be formed by performing a series of processing steps in lieu of the anisotropic etch process of FIG. 1F. For example, the materials of the interconnect-level dielectric material layers 20 may be etched selectively to the material of the etch stop dielectric material layer 30 after the processing steps of FIG. 1F. In such an embodiment, the materials of the interconnect-level dielectric material layers 20 may be isotropically etched by providing at least one isotropic etchant through the upper portion of the vertically-extending trench 69. The vertically-extending trench 69 can be laterally expanded to provide a bottle-shaped profile and/or the retro-tapered surfaces illustrated in FIG. 6B.

Figure 7A:
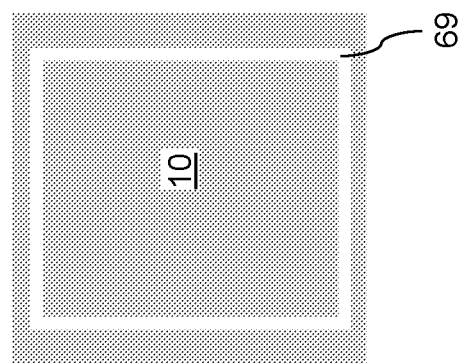
FIGS. 7A-7C illustrate various horizontal cross-sectional views of vertically-extending trenches that may be used in any of the embodiments of the present disclosure.
Figure 7B:
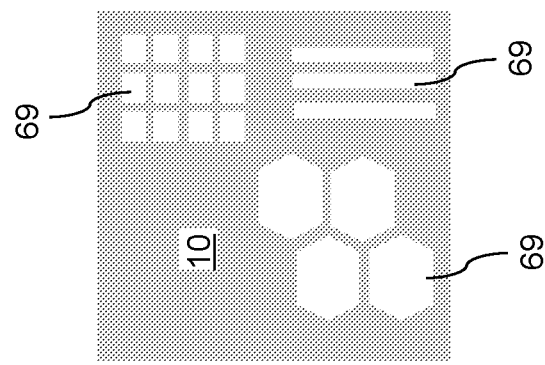
Figure 7C:
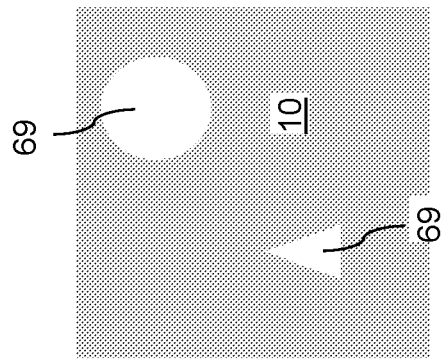

Referring to FIGS. 7A-7C illustrate various horizontal cross-sectional views (which can be the same as a respective top-down view) of vertically-extending trenches 69 that may be used in any of the embodiments of the present disclosure. In some embodiments, the vertically-extending cavities 69 may have an annular rectangular shape or any other polygonal or curvilinear annular shape as illustrated in FIG. 7A. In some embodiments, the vertically-extending cavities 69 may have a non-annular polygonal or generally curvilinear shape having a respective single periphery as illustrated in FIGS. 7B and 7B. The width w illustrated in FIG. 1F can correspond to a lateral distance between each facing pair of sidewall segments. For example, the width w illustrated in FIG. 1F may correspond to a lateral separation distance between lengthwise sidewalls of a rectangular portion of a shape, or a diameter of a circle. In embodiments in which a facing pair of sidewall segments is absent, such as in embodiments of a triangular shape, the width w illustrated in FIG. 1F may be defined between a straight sidewall and a distal apex of a polygon. Generally, the lateral thickness of each outgassing-material-containing portion 62 can be controlled such that a vertically-extending cavity 69' is formed within each vertically-extending trench 69 at the processing steps of FIG. 1H.

Figure 8A:
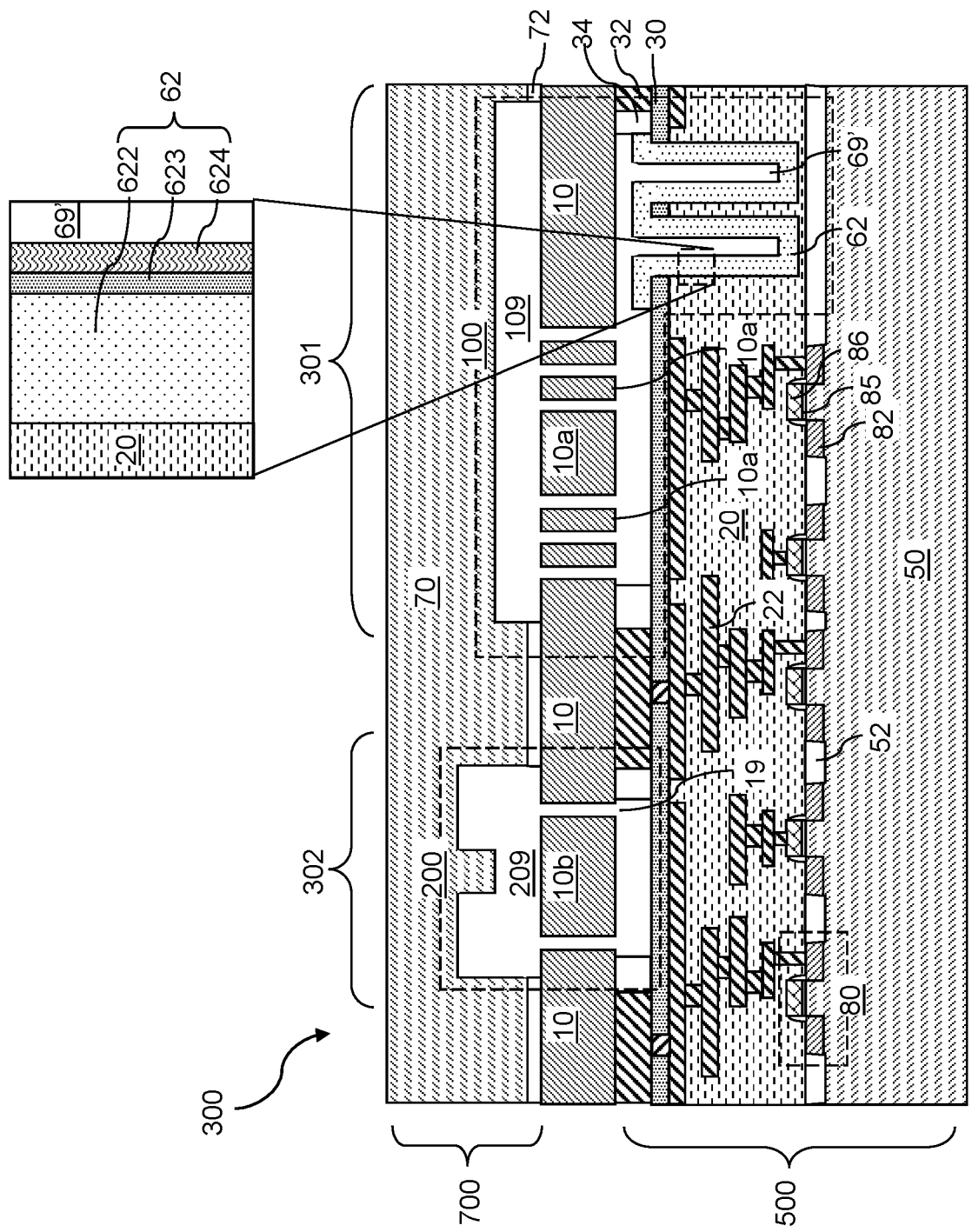
FIG. 8A is a vertical cross-sectional view of a first exemplary configuration of a fifth exemplary MEMS device in accordance with a fifth embodiment of the present disclosure.

Referring to FIG. 8A, a first exemplary configuration of a fifth exemplary MEMS device 300 in accordance with a fifth embodiment of the present disclosure is illustrated. The first exemplary MEMS device 300 can be derived from any of the first through fourth MEMS devices 300 described above by depositing a plurality of layers for the outgassing-material-containing layer 62L. For example, the outgassing-material-containing layer 62L can be formed by sequentially depositing an outgassing material layer 622, an adhesion promotion material layer 623, and a hydrophobic coating layer 624. The outgassing material layer 622 includes an outgassing material such as silicon oxide formed by high density plasma chemical vapor deposition process or any of the other outgassing materials described above. Other suitable materials that are within the contemplated scope of disclosure.

The adhesion promotion material layer 623 includes a material that provides enhanced adhesion of the material of the hydrophobic coating layer 624 to the outgassing material layer 622. The adhesion promotion material layer 623 prevents peeling off of the outgassing material layer 622, and thus, prevents particulate generation and blockage of movement of a movable element in an encapsulated cavity. In an illustrative example, the adhesion promotion material layer 623 can include a silicon oxide material having a different material composition than the material of the outgassing material layer 622 and provides a continuous silicon oxide surface that functions as a better nucleation surface for the material of the hydrophobic coating layer 624. For example, the adhesion promotion material layer 623 can include silicon oxide formed by plasma enhanced chemical vapor deposition process or by an atomic layer deposition process. The thickness of the adhesion promotion material layer 623 can be in a range from 1 nm to 20 nm, although lesser and greater thicknesses can also be used. In an embodiment, the adhesion promotion material layer 623 may be thick enough, e.g., greater than 1 nm in thickness, to form a continuous material layer, and may be thin enough, e.g., less than 20 nm, to minimize the volume occupied by the adhesion promotion material layer 623 and to provide more space for the outgassing material layer.

The hydrophobic coating layer 624 can include a material providing a hydrophobic surface. In one embodiment, the hydrophobic coating layer 624 can include, and/or can consist essentially of, a self-assembly polymer material having a hydrophobic functional group that is physically exposed to the ambient. In one embodiment, the hydrophobic coating layer 624 can include a self-assembly polymer material that can be coated on the surface of the adhesion promotion material layer 623. For example, organosilane precursors such as $CF_3(CF_2)_5(CH_2)_2SiCl_3$ (FOTS), $CF_3(CF_2)_5(CH_2)_2Si(OC_2H_5)_3$ (FOTES), $CF_3(CF_2)_5(CH_2)_2Si(CH_3)Cl_2$ (FOMDS), $CF_3(CF_2)_5(CH_2)_2Si(CH_3)_2Cl$ (FOMMS), $CF_3(CF_2)_7(CH_2)_2SiCl_3$ (FDTS), or $CH_3(CH_2)_{17}(CH_2)_2SiCl_3$ (OTS). Other suitable materials that are within the contemplated scope of disclosure. Processes for forming a layer of a self-assembly polymer material having a physically exposed hydrophobic functional group is known, for example, in Zhuang et al., Vapor-Phase Self-Assembled Monolayers for Anti-Stiction Applications in MEMS, Journal of Microelectromechanical Systems 16(6): 1451-1460, January 2008.

The hydrophobic coating layer 624 and the adhesion promotion material layer 623 can be patterned concurrently with patterning of the outgassing material layer 622 at the processing steps of FIG. 1H or any equivalent processing steps for patterning the outgassing-material-containing layer 62L. The first exemplary configuration of the fifth exemplary MEMS device 300 can include an adhesion promotion material layer 623 over each portion (including each vertically-extending outgassing material portion) of the outgassing material layer 622, and a hydrophobic coating layer 624 located on the adhesion promotion material layer 623. In such an embodiment, each vertically-extending outgassing material portion (comprising an outgassing material layer 622) within an outgassing-material-containing portion 62 can contact a respective adhesion promotion material layer 623, which contacts a respective hydrophobic coating layer 624.

Figure 8B:
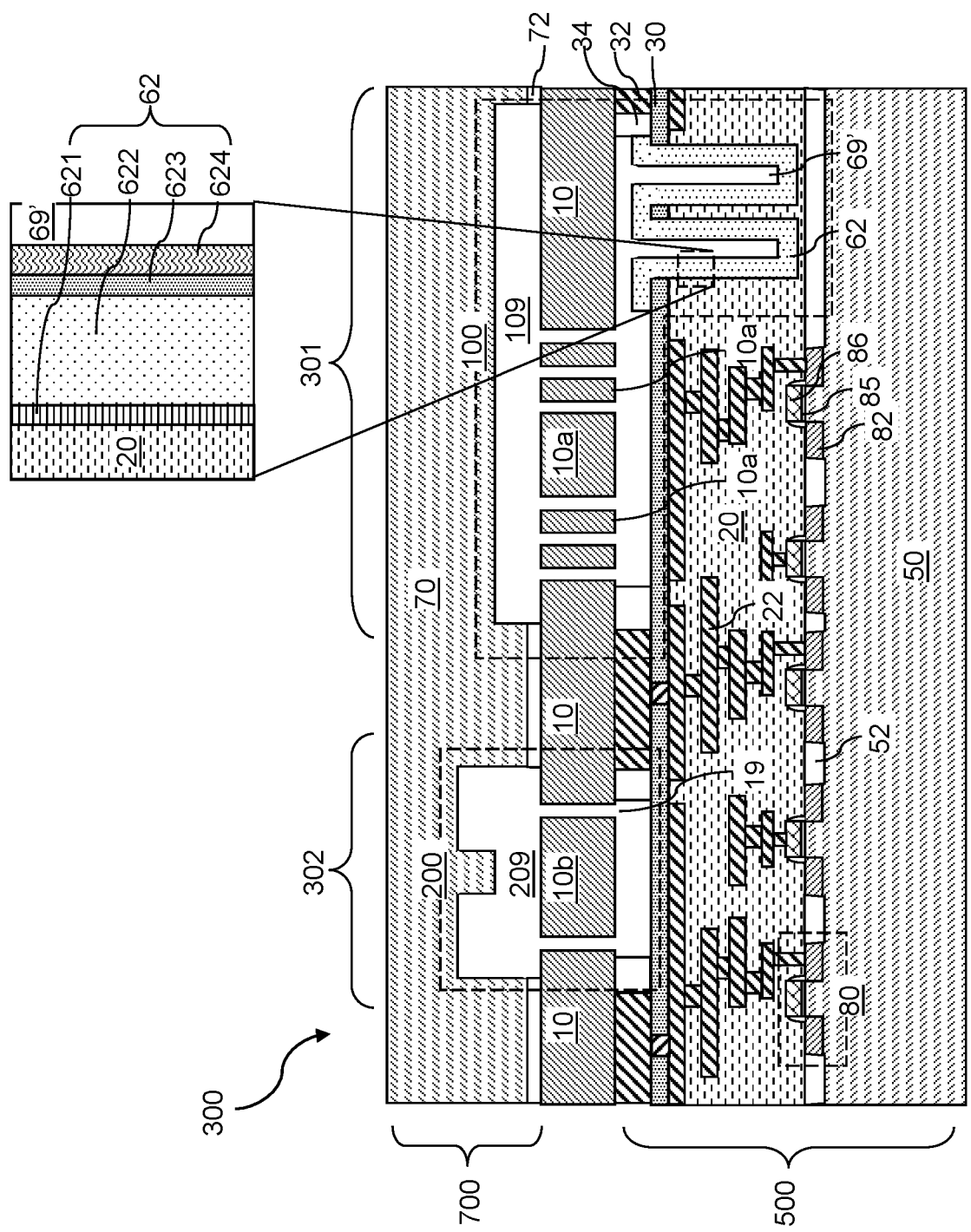
FIG. 8B is a vertical cross-sectional view of a second exemplary configuration of a fifth exemplary MEMS device in accordance with the fifth embodiment of the present disclosure.

Referring to FIG. 8B, a second exemplary configuration of the fifth exemplary MEMS device 300 can be derived from the first exemplary configuration of the fifth exemplary MEMS device 300 by using a glue material layer 621 to enhance adhesion of the outgassing material layer 622 to the matrix layer 10 and/or to the interconnect-level dielectric material layers 20. In one embodiment, the glue material layer 621 can include a silicon oxide material including less gas than the outgassing material layer 622. For example, the glue material layer 621 can include silicon oxide formed by plasma enhanced chemical vapor deposition process or by an atomic layer deposition process. The thickness of the glue material layer 621 can be in a range from 3 nm to 60 nm, although lesser and greater thicknesses can also be used. In such an embodiment, each vertically-extending outgas sing material portion (comprising an outgassing material layer 622) within an outgassing-material-containing portion 62 can be attached to the matrix layer 10 through a respective glue material layer 621. Each hydrophobic coating layer 624 can comprise, and/or can consist essentially of, a self-assembly polymer material having a hydrophobic functional group that is physically exposed to the first sealed chamber 109.

In an alternative embodiment, the at least one vertically-extending trench 69 may be formed in the cap structure 700, and may vertically extend through the first capping surface overlying the first sealed chamber 109. In such an embodiment, each vertically-extending outgassing material portion (comprising an outgassing material layer 622) within an outgassing-material-containing portion 62 can be formed in the cap structure 700, and can be attached to a portion of the cap structure 700 that faces the matrix layer 10 through a respective glue material layer 621. Each hydrophobic coating layer 624 can comprise, and/or can consist essentially of, a self-assembly polymer material having a hydrophobic functional group that is physically exposed to the first sealed chamber 109.

With reference to the embodiments illustrated in FIGS. 8A and 8B, by providing multiple layers to the outgassing film, such as the hydrophobic coating layer 624, risk of stiction of the movable elements 10a, 10b may be reduced.

Figure 9A:
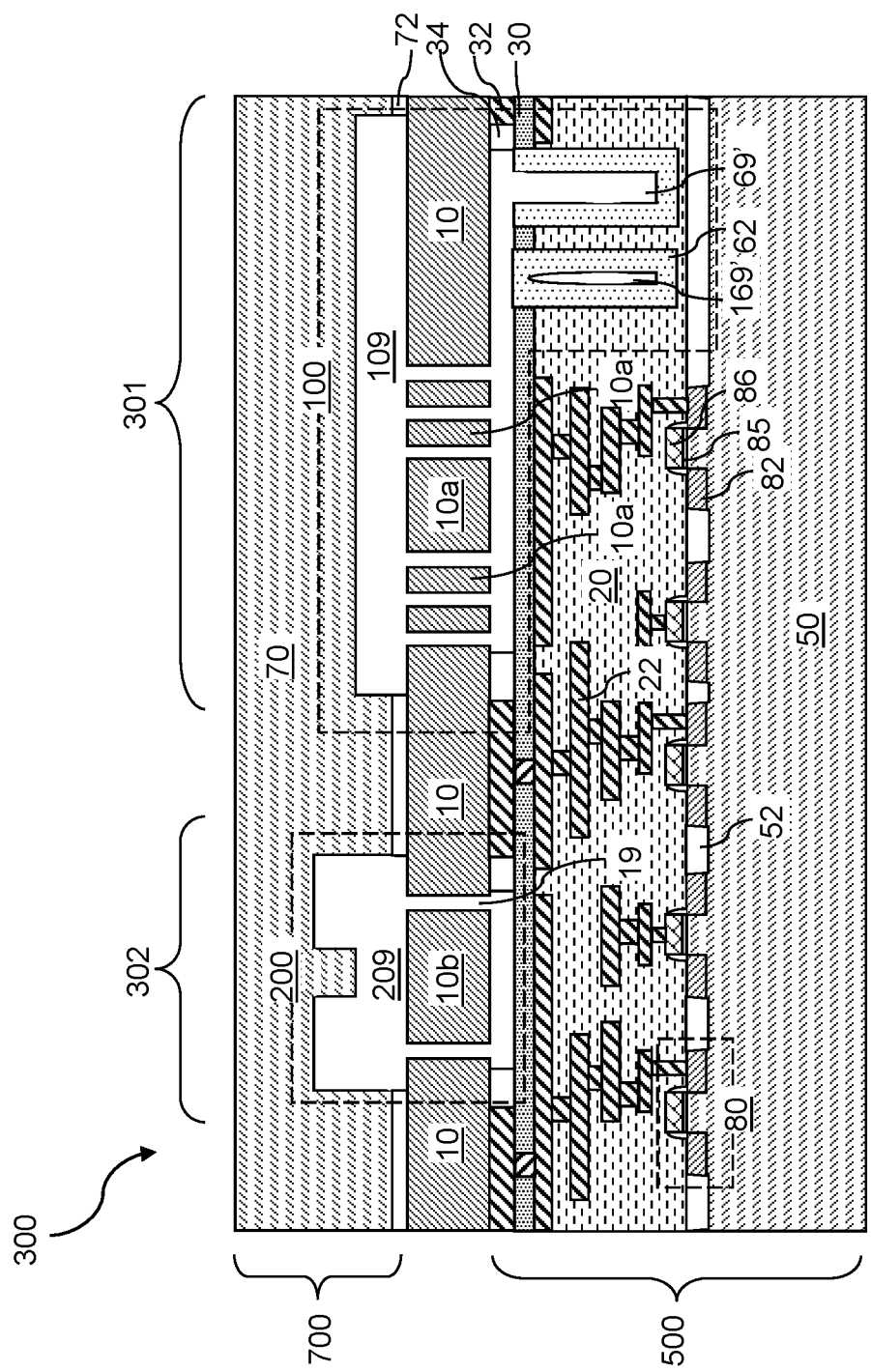
FIG. 9A is a vertical cross-sectional view of a first exemplary configuration of a sixth exemplary MEMS device in accordance with a sixth embodiment of the present disclosure.
Figure 9B:
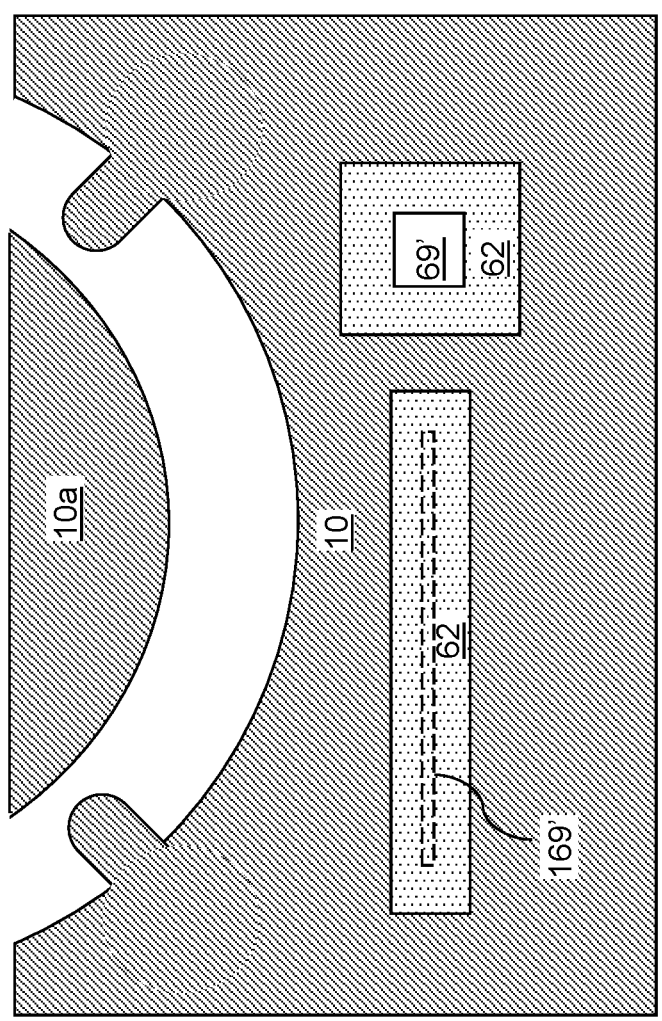
FIG. 9B is a horizontal cross-sectional view of the sixth exemplary MEMS device at the level of the matrix layer of FIG. 9A.

Referring to FIGS. 9A and 9B, a sixth exemplary MEMS device 300 can be derived from any of the preceding exemplary MEMS devices 300 of the present disclosure by forming at least one encapsulated vertically-extending cavity 169' that are spaced apart from the first sealed chamber 109 and at least one vertically-extending cavity 69' that is a portion of a first sealed chamber 109. For example, the at least one encapsulated vertically-extending cavity 169' may be disconnected from the first sealed chamber 109 by a region of an outgas sing-material-containing portion 62 located at the opening of a respective vertically-extending trench 69, and the at least one vertically-extending cavity 69' can be connected to the first head volume of the first sealed chamber 109 by the opening of a respective vertically-extending trench 69.

Figure 10:
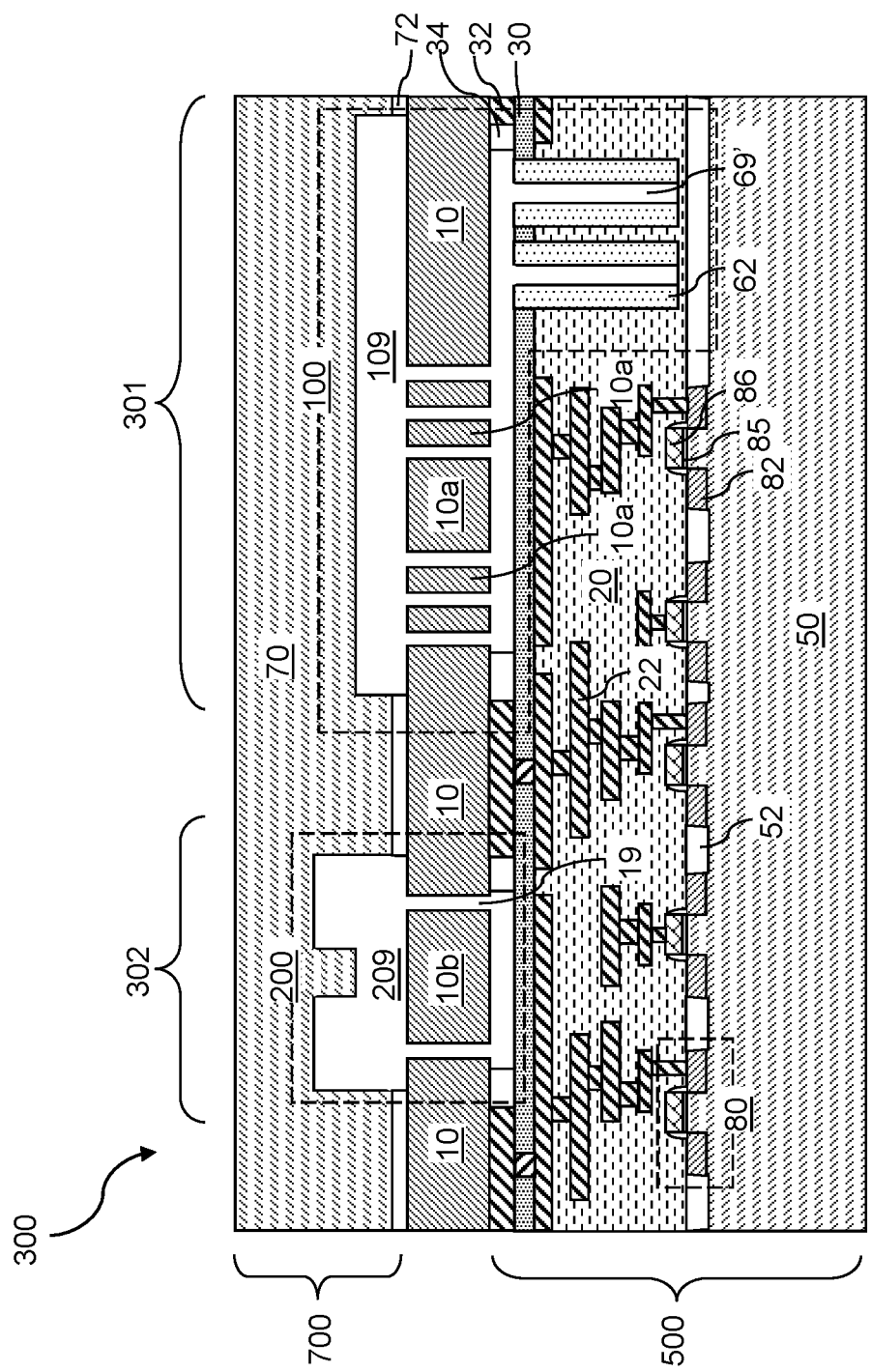
FIG. 10 is a vertical cross-sectional view of a seventh exemplary MEMS device in accordance with the seventh embodiment of the present disclosure.

Referring to FIG. 10, seventh exemplary MEMS device 300 in accordance with the seventh embodiment of the present disclosure is illustrated. In this embodiment, an anisotropic etch process such as a reactive ion etch process. Each outgassing-material-containing portion 62 can be formed as a sidewall spacer. A bottom surface of each vertically-extending trench 69 may be physically exposed after the anisotropic etch process. The outgassing-material-containing portion(s) 62 can include any material composition and/or any layer stack described above.

Vertically-extending surfaces of the outgassing-material-containing portions 62 can be physically exposed to vertically-extending cavities 69' that are portions of the first sealed chamber 109. Bottom surfaces of each vertically-extending trench 69 can be physically exposed to the first sealed chamber 109. The bottom surfaces of the vertically-extending trenches 69 may be surfaces of the interconnect-level dielectric material layers 20 or surfaces of the MEMS substrate 50 in embodiments in which the vertically-extending trenches 69 extend into the MEMS substrate 50, or may be surfaces of the cap structure 700 in embodiments in which the vertically-extending cavities 69 are formed into the cap structure 700.

Figure 11:
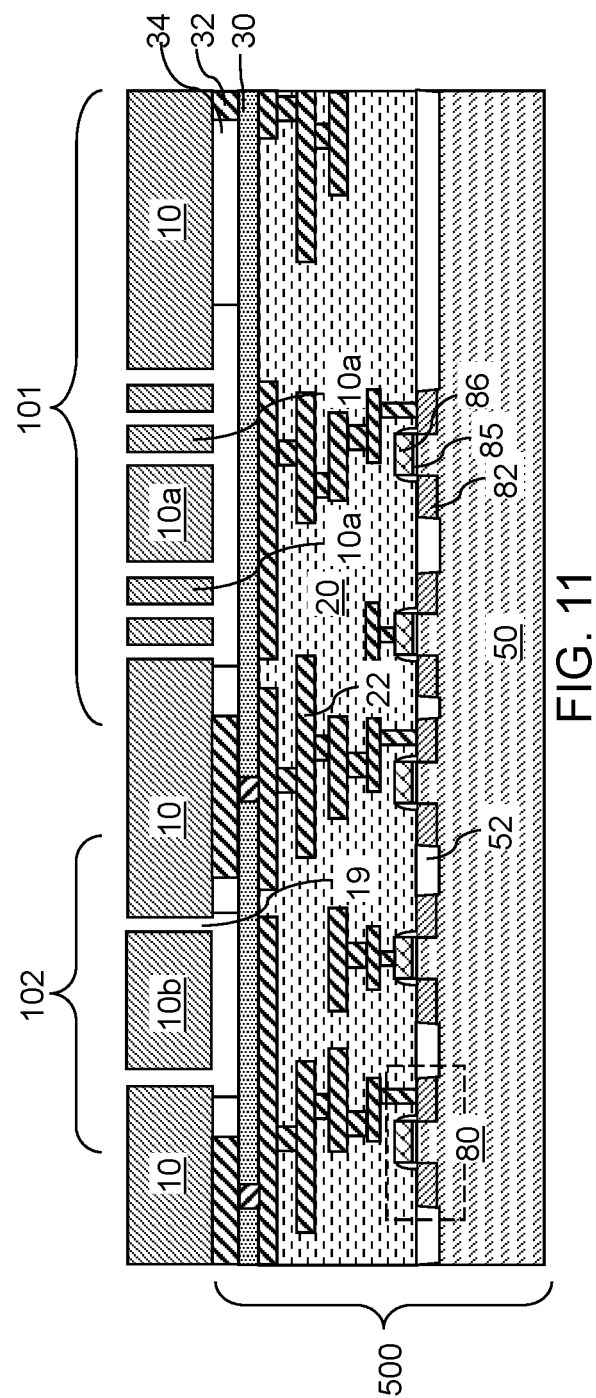
FIG. 11 is a vertical cross-sectional view of an exemplary structure for forming a MEMS assembly in accordance with a eighth embodiment of the present disclosure.

Referring FIG. 11, an exemplary structure for forming a MEMS assembly in accordance with a eighth embodiment of the present disclosure is provided, which can be provided from the exemplary structure of FIG. IF by omitting the processing steps of FIGS. 1F, 1G, and 1H, and by performing the processing steps of FIGS. 1I, 1J and 1K. In other words, the vertically-extending trenches 69 and the outgas sing-material-containing portions 62 are not formed into the MEMS support structure 500.

Figure 12A:
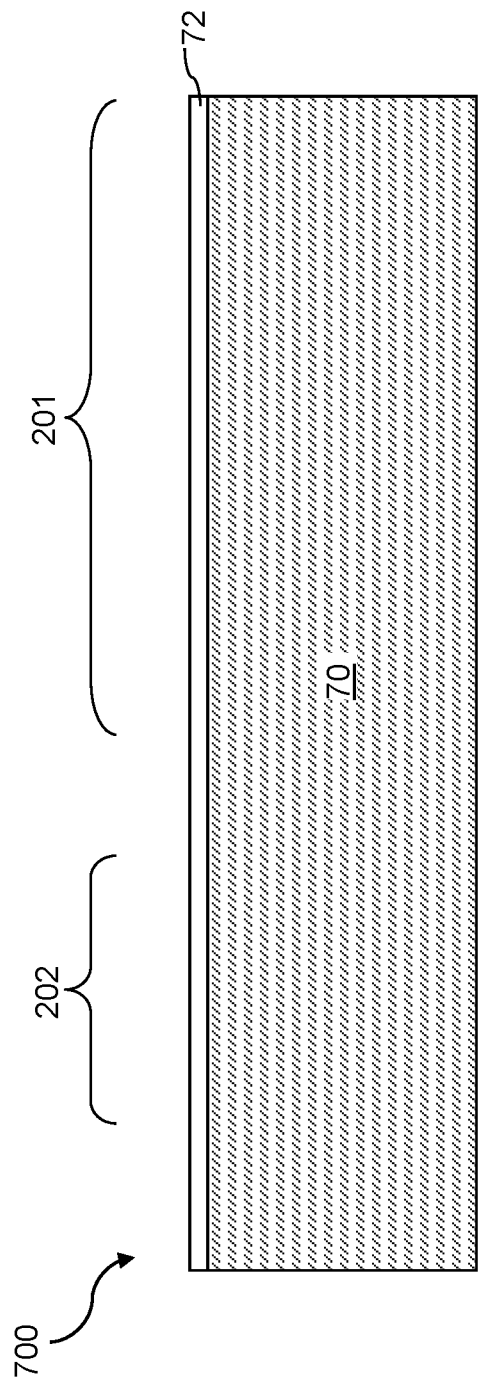
FIG. 12A is a vertical cross-sectional view of an exemplary structure for forming a cap structure after formation of a bonding material layer in accordance with the eighth embodiment of the present disclosure.

Referring to FIG. 12A, a cap structure 700 in accordance with the eighth embodiment of the present disclosure is illustrated after formation of a bonding material layer 72 on a top surface of a cap substrate 70. The exemplary structure of FIG. 12A can be the same as the exemplary structure of FIG. 2A.

Figure 12B:
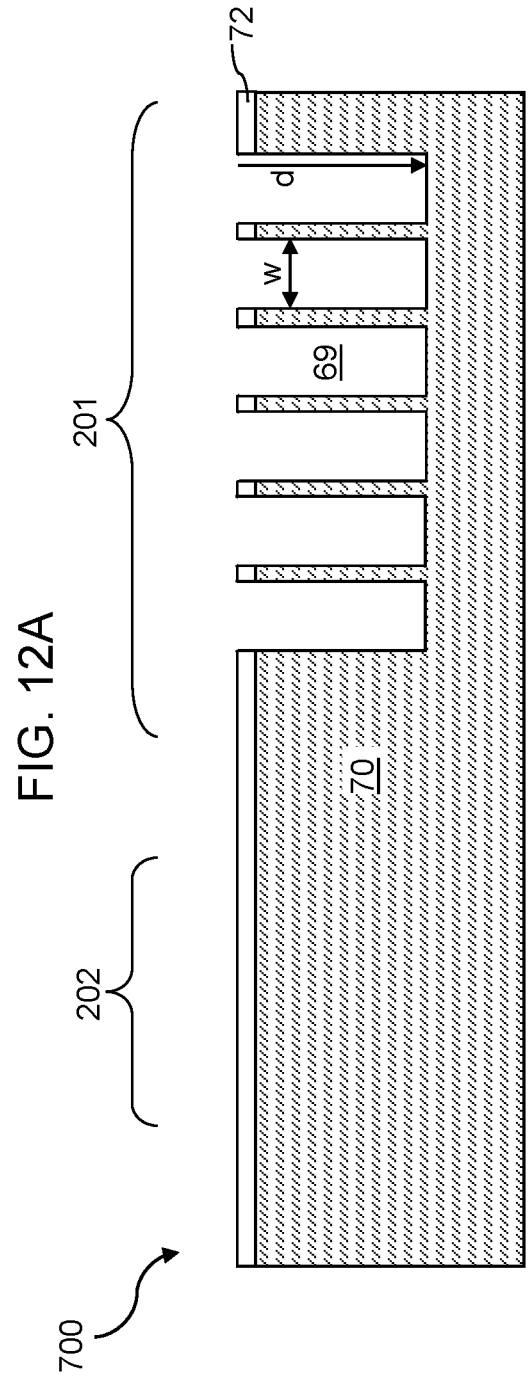
FIG. 12B is a vertical cross-sectional view of an exemplary structure for forming the cap structure after formation of vertically-extending trenches in accordance with the eighth embodiment of the present disclosure.

Referring to FIG. 12B, a photoresist layer (not shown) can be applied over the bonding material layer 72, and can be lithographically patterned to form at least one opening within the area of the first device region 201. An anisotropic etch process can be performed using the patterned photoresist layer to form vertically-extending trenches 69. The vertically extending trenches 69 can vertically extend through an upper portion of the cap structure 700. Each vertically-extending trench 69 can have a bottom surface within the cap structure 700. The at least one vertically-extending trench 69 can include a plurality of vertically-extending trenches 69.

Each vertically-extending trench 69 can have a respective width w at a topmost portion, i.e., at a periphery that adjoins the top surface of the matrix layer 10. The width w can be measured between top edges of opposing segments of the sidewalls for each vertically-extending trench 69 that face each other. The width w may be uniform throughout a vertically-extending trench 69, for example, for a vertically-extending trench 69 having a rectangular opening or for a vertically-extending trench having an inner sidewall and an outer sidewall located on a respective arc of two concentric circles having different radii. Alternatively, one or more of the at least one vertically-extending trench 69 can have a width modulation. For example, the maximum width of a vertically-extending trench 69 having a width modulation may be the width w, and the vertically-extending trench 69 can include at least one region having a lesser width than the width w.

Further, each vertically-extending trench 69 can have a respective depth d between a top periphery and a bottom surface. For each vertically-extending trench 69, the depth d can be at least twice the width w. In one embodiment, the aspect ratio of each vertically-extending trench 69, i.e., the ratio of the depth d to the width w, can be in a range from 2 to 40, such as from 3 to 10. In one embodiment, each vertically-extending trench 69 can have straight sidewalls.

In such an embodiment, the straight sidewalls of each vertically-extending trench 69 may be vertical, or may have a taper angle greater than 0 degree and less than 45 degrees, such as between 0 degree and 10 degrees. Alternatively, the sidewalls of the vertically-extending trench 69 may be convex or concave with a generally decreasing width with an increasing distance from the horizontal plane including the top surface of the cap structure 700. In an non-limiting illustrative example, each vertically-extending trench 69 can have a width w in a range from 150 nm to 5,000 nm, and a depth in a range from 300 nm to 10,000 nm, although lesser and greater dimensions can also be used.

Figure 12C:
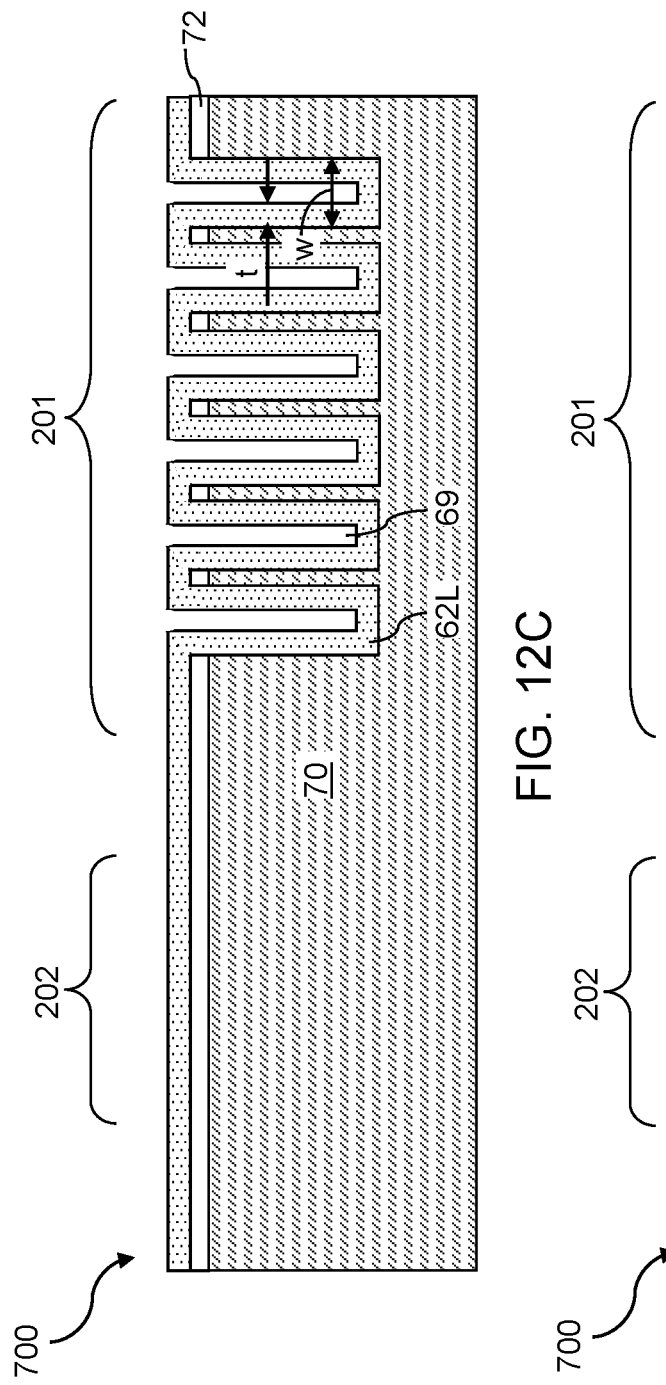
FIG. 12C is a vertical cross-sectional view of an exemplary structure for forming the cap structure after formation of an outgassing-material-containing layer in accordance with the eighth embodiment of the present disclosure.

Referring to FIG. 12C, an outgassing-material-containing layer 62L can be deposited in each vertically-extending trench 69 and over the top surface of the bonding dielectric layer 72. The outgassing-material-containing layer 62L includes at least one continuous layer that contains an outgassing material that is herein referred to as at least one continuous outgassing material layer. The outgassing-material-containing layer 62L may consist of the at least one continuous outgassing material layer in some embodiments, or may include at least one additional material layer in some other embodiments to be subsequently described. In one embodiment, the outgassing-material-containing layer 62L may consist of a single continuous outgassing material layer or a stack of multiple continuous outgas sing material layers.

Each continuous outgassing material layer within the outgassing-material-containing layer 62L includes an outgassing material that is capable of outgassing at a temperature above room temperature. Any outgassing material or a layer stack including an outgassing material described above may be used to form the outgassing-material-containing layer 62L. The lateral thickness t of each vertical portion of the outgas sing-material-containing layer 62L at an opening of a respective vertically-extending trench 69 is less than one half of the width w of the respective vertically-extending trench 69. For example, the lateral thickness t of each vertical portion of the outgassing-material-containing layer 62L can be in a range from 50 nm to 2,500 nm, although lesser and greater lateral thicknesses can also be used. Generally, the lateral thickness t of each vertical portion of the outgassing-material-containing layer 62L may be thick enough to contain a significant amount of the outgassing material (e.g., by being greater than 50 nm), and may be thin enough to enable deposition by commercially available film deposition techniques such as chemical vapor deposition (e.g., by being less than 2,500 nm). A vertically-extending cavity 69' is present within a center region of each vertically-extending trench 69. Thus, each vertically-extending portion of the outgas sing-material-containing layer 62L can be physically exposed to a respective vertically-extending trench 69. Each physically exposed surface of a vertically-extending portion of the outgas sing-material-containing layer 62L can include a vertically-extending surface, i.e., a surface that extends along a vertical direction, and may have a straight sidewall, a concave sidewall, or a convex sidewall. If a physically exposed surface of a vertically-extending portion of the outgassing-material-containing layer 62L has a straight sidewall, the straight sidewall may be vertical or tapered.

Figure 12D:
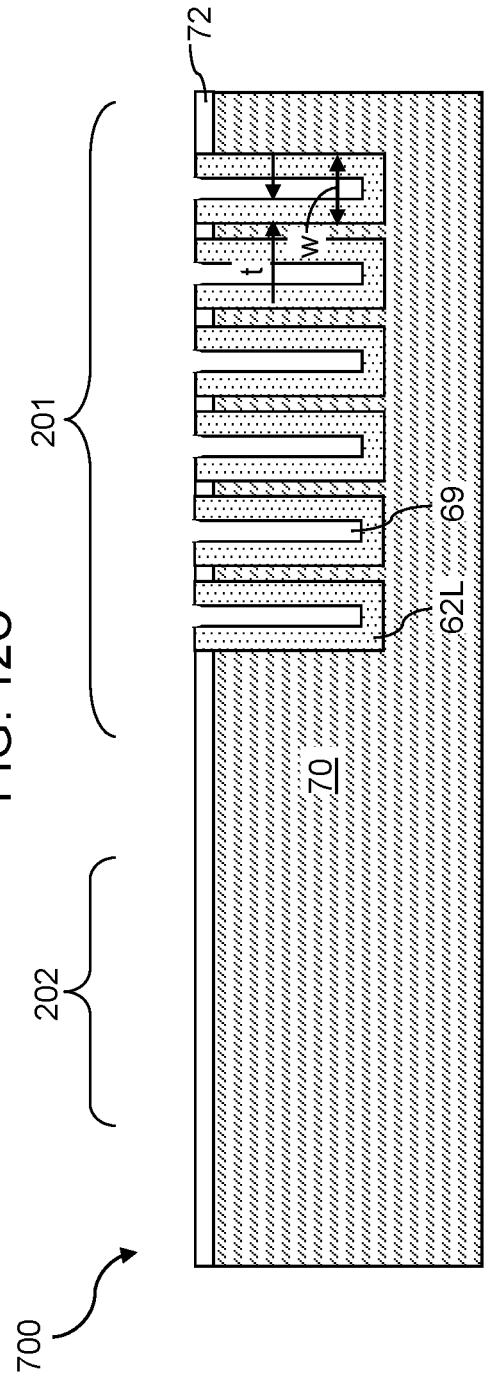
FIG. 12D is a vertical cross-sectional view of the exemplary structure for forming the cap structure after formation of outgassing-material-containing portions in accordance with the eighth embodiment of the present disclosure.

Referring to FIG. 12D, the horizontal portion of the outgassing-material-containing layer 62L that overlies the horizontal surface including the top surface of the bonding dielectric layer 72 can be removed by a planarization process. For example, a chemical mechanical planarization (CMP) process can be performed to remove the horizontal portion of the outgas sing-material-containing layer 62L that overlies the horizontal surface including the top surface of the bonding dielectric layer 72. Each remaining portion of the outgas sing-material-containing layer 62L located within a respective vertically-extending trench 69 constitutes an outgassing-material-containing portion 62.

Generally, a horizontal portion of a continuous outgas sing material layer within the outgassing-material-containing layer 62L is removed outside the region including the at least one vertically-extending trench 69. The horizontal portion of a continuous outgassing material layer within the outgassing-material-containing layer 62L can be removed by chemical mechanical planarization process, an anisotropic etch process that does not use any etch mask layer, or an anisotropic etch process that uses an etch mask layer (such as a patterned photoresist layer) that covers the region including the at least one vertically-extending trench 69. Thus, the outgassing-material-containing layer 62L may be entirely removed from above the horizontal plane including the top surface of the bonding dielectric layer 72, or only outside the area that is not covered by the etch mask layer. If an etch mask layer is used, the etch mask layer can continuously extend over the entire area of the at least one vertically-extending trench 69.

Each outgassing-material-containing portion 62 can include a vertically-extending outgassing material portion having a vertically-extending surface. Each vertically-extending surface of the outgassing-material-containing portions 62 may have a straight sidewall, a concave sidewall, or a convex sidewall. If an outgassing-material-containing portion 62 has a straight sidewall, the straight sidewall may be vertical or tapered. Each vertically-extending surface of the vertically-extending outgassing material portion can be physically exposed a respective vertically-extending cavity 69' that is located in a respective vertically-extending trench 69.

Figure 12E:
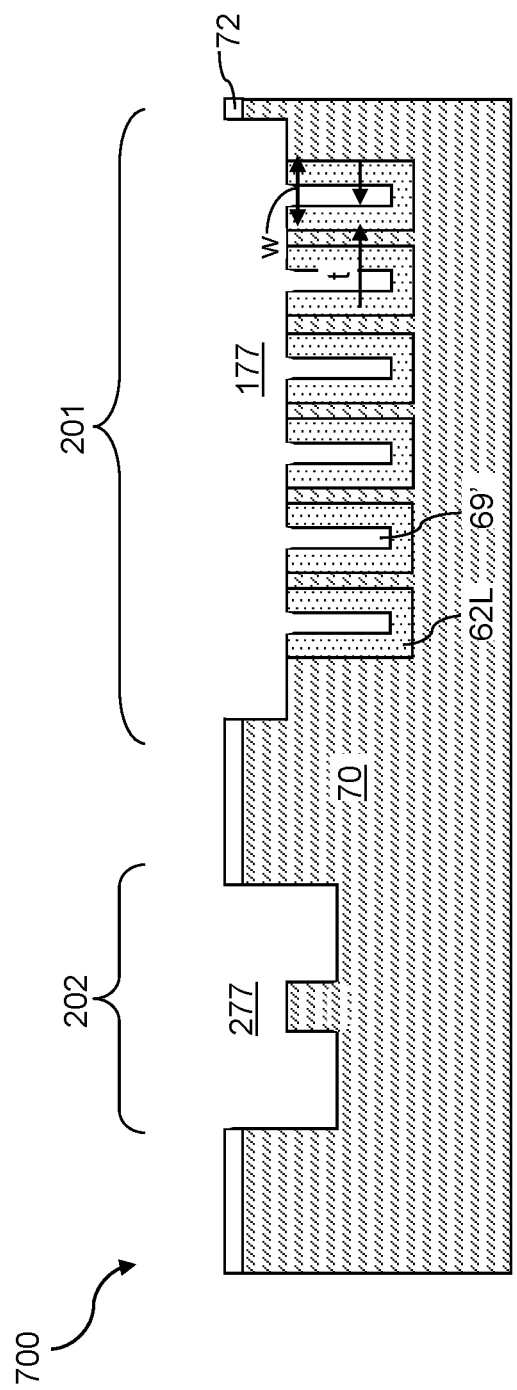
FIG. 12E is a vertical cross-sectional view of a cap structure in accordance with the eighth embodiment of the present disclosure.

Referring to FIG. 12E, the top surface of the cap structure 700 can be patterned using at least one combination of a lithographic patterning process and an etch process. In each lithographic patterning process, a photoresist layer is applied over a top surface of the cap structure, and is lithographically exposed and developed to form a patterned photoresist layer that functions as an etch mask layer. In each etch process, unmasked surface portions of the cap structure 700 and the outgassing-material-containing portions 62 are vertically recessed using the patterned photoresist layer as an etch mask layer. The etch process can include an anisotropic etch process (such as a reactive ion etch process). The duration of the etch process can be selected to control the depth of the recesses formed by the etch process. The photoresist layer can be removed after the etch process.

A first recess region 177 having a first recessed surface can be formed in the first device region 201, and a second recess region 277 having a second recessed surface can be formed in the second device region 202. The first recessed surface is subsequently used as a first capping surface for the first movable element 10a, and the second recessed surface is subsequently used as a second capping surface for the second movable element 10b. Multiple combination of a lithographic patterning process and an etch process can be performed to provide various recessed surfaces having different depth across various device regions. For example, a recessed surface in the first device region 201 may have a different recess depth than a recessed surface in the second device region 202. Further, at least one of the recessed surfaces may have steps to provide a pattern in a respective recessed surface. The pattern and the depth of each recessed surface can be optimized for each MEMS device to be formed in the various device regions. The depths of the recessed surfaces, as measured from the top surface of the bonding material layer 72, may be in a range from 50 nm to 1 micron, although lesser and greater depths can also be used.

An upper periphery of each vertically-extending outer sidewall of the outgassing-material-containing portion 62 can be adjoined to a same horizontal surface, which is herein referred to as a horizontal reference surface. In one embodiment, the horizontal reference surface can be a recessed horizontal surface (i.e., a first capping surface) of the cap structure 700.

In one embodiment, each vertically-extending outgassing material portion 62 located inside a respective one of the at least one vertically-extending trench 69 can have an outer sidewall that adjoins a horizontal reference surface that is a horizontal surface of the cap structure 700. In one embodiment, each vertically-extending outgas sing material portion of the outgassing-material-containing portion 62 can have a vertical extent that is greater than a lateral dimension, such as the width w, of the respective one of the at least one vertically-extending trench 69 at a level of the reference horizontal plane. In one embodiment, each vertically-extending outgas sing material portion of the outgassing-material-containing portion 62 can have a lateral thickness t that is less than one half of the lateral dimension, such as the width w, of the respective one of the at least one vertically-extending trench 69.

Figure 13:
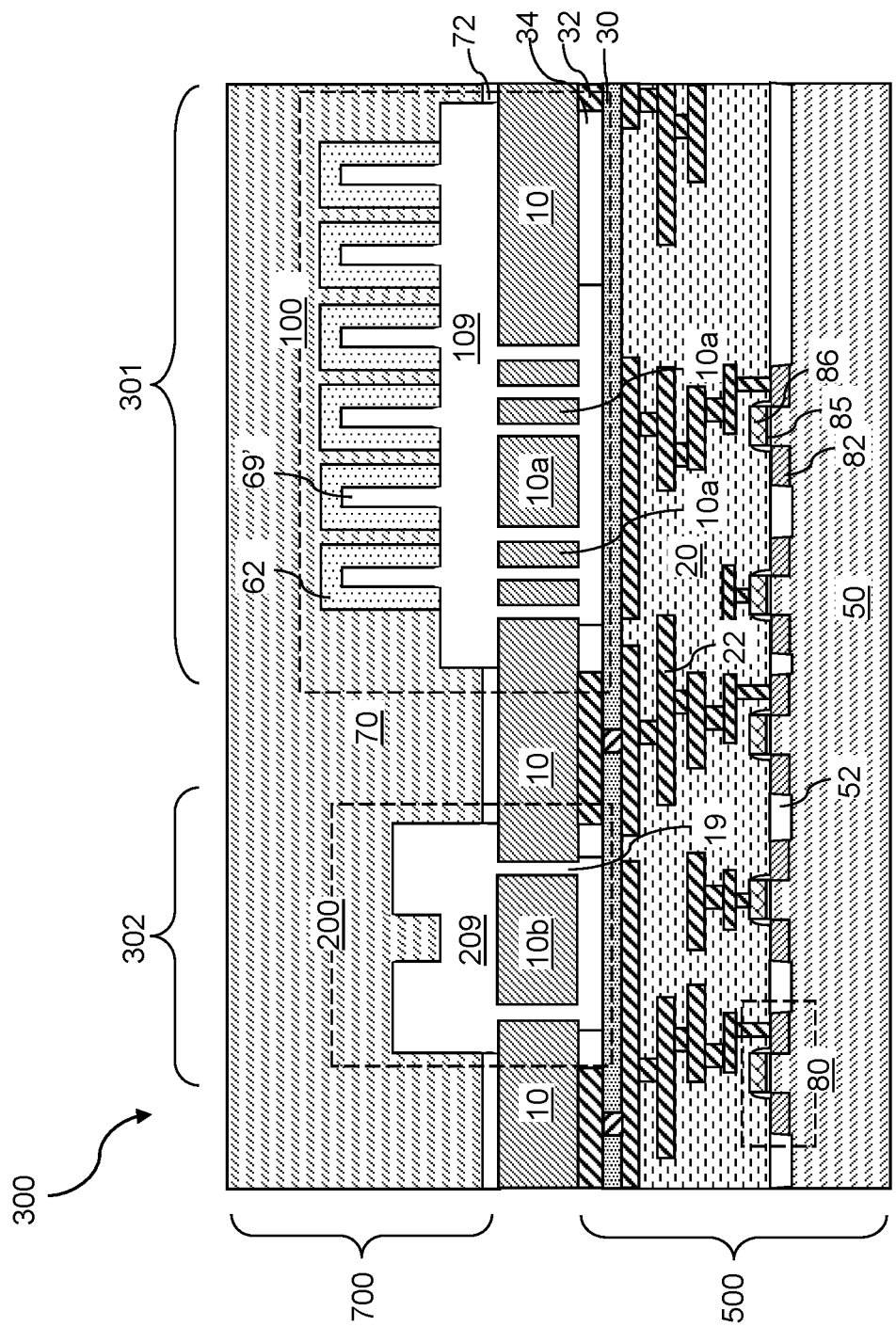
FIG. 13 is a vertical cross-sectional view of a eighth exemplary MEMS device in accordance with the eighth embodiment of the present disclosure.

Referring to FIG. 13, the exemplary structure of FIG. 12E may be bonded to the MEMS assembly of FIG. 11 to form a eighth exemplary MEMS device 300. Any of the bonding methods described above may be used to bond the cap structure 700 to the MEMS assembly.

A first sealed chamber 109 including a first movable element 10a may be formed by aligning the first recess region of the cap structure 700 over the first movable element 10a during bonding the cap structure 700 to the matrix layer 10. The first sealed chamber 109 includes a first head volume that overlies the first movable element 10a, and the second sealed chamber 209 includes a second head volume that overlies the second movable element 10b. The first sealed chamber 109 may be laterally bounded by the matrix layer 10 and may be vertically bounded by the first capping surface that overlies the first movable element 10a. A first MEMS device 100 includes the first movable element 10a, the first sealed chamber 109, and the first capping surface. The first MEMS device 100 may form an accelerometer.

A second sealed chamber 209 including a second movable element 10b may be formed by aligning the second recess region of the cap structure 700 over the second movable element 10b during bonding the cap structure 700 to the matrix layer 10. The second sealed chamber 209 may include a second head volume that overlies the second movable element 10b. The second sealed chamber 209 may be vertically bounded by a second capping surface that overlies the second movable element 10b. The second capping surface can comprise the planar horizontal surface of the cap structure 700 located within the second recess region. The second sealed chamber 209 may be vertically bounded by the second capping surface that overlies the second movable element 10b. A second MEMS device 200 may include the second movable element 10b, the second sealed chamber 209, and the second capping surface. The MEMS device of the present disclosure can be a composite MEMS device including the first MEMS device 100 (which can include an accelerometer) and the second MEMS device 200 (which can include a gyroscope).

The outgassing-material-containing portions 62 can include any outgassing material or a layer stack including an outgassing material described above. In one embodiment, each respective vertically-extending outgas sing material portion of the outgas sing-material-containing portions 62 may be located entirely within a volume of a respective vertically-extending trench 69. In some embodiments, each vertically-extending outgassing material portion can contact a respective adhesion promotion material layer 623 which contacts a respective hydrophobic coating layer 624. In some embodiments, each vertically-extending outgassing material portion is attached to the portion of the cap structure 700 that faces the matrix layer 10 through a respective glue material layer 621. In some embodiments, each hydrophobic coating layer 624 comprises a self-assembly polymer material having a hydrophobic functional group that is physically exposed to the first sealed chamber 109.

Figure 14:
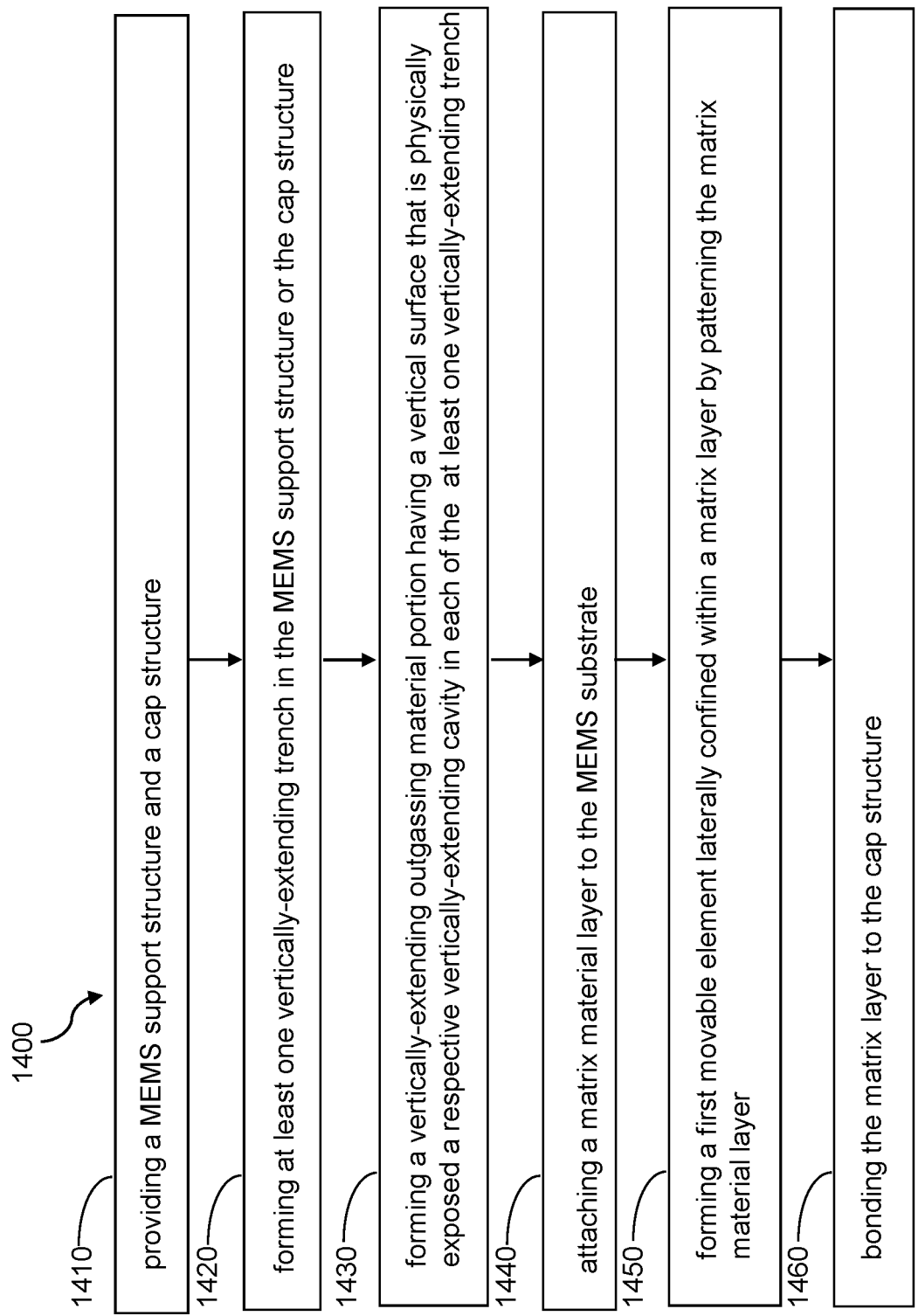
FIG. 14 is a flow chart illustrating a set of processing steps that may be performed to form a MEMS device according to embodiments of the present disclosure.

Referring to FIG. 14, a flow chart 1400 illustrating a set of processing steps is illustrated. The set of processing steps may be performed to form a MEMS device according to embodiments of the present disclosure.

At step 1410, a MEMS support structure 500 and a cap structure 700 can be provided. At step 1420, at least one vertically-extending trench 69 can be formed in the MEMS support structure 500 or the cap structure 700. At step 1430, a vertically-extending outgassing material portion (which can be provided within a respective outgassing-material-containing portion 62) having a surface that is physically exposed a respective vertically-extending cavity 69' (i.e., in contact with the respective vertically-extending cavity 69') can be formed in each of the at least one vertically-extending trench 69. At step 1440, a matrix material layer 10L can be attached to the MEMS support structure 500, for example, by bonding the matrix material layer 10L and optionally thinning the matrix material layer 10L to form a thinned matrix material layer 10T. At step 1450, a first movable element 10a laterally confined within a matrix layer 10 can be formed by patterning the matrix material layer 10L (or the thinned matrix material layer 10T). At step 1460, the matrix layer 10 can be bonded to the cap structure 700. A first sealed chamber 109 containing the first movable element 10a is formed. Each vertically-extending outgassing material portion has a surface that is physically exposed to the first sealed chamber 109, which may include a vertically-extending surface exposed to a vertically-extending cavity 69' and/or a horizontal surface of a outgas sing-material-containing portion 62 exposed to a vertically-extending cavity 69' or including an encapsulated vertically-extending cavity 169'.

The various embodiments disclosed herein provide an outgassing film 62 that covers the sidewalls of vertically-extending cavities 69, wherein the vertically-extending cavity 69 may be formed in the MEMS support structure 500 or in the cap structure 700. Typically, a well in a sealed chamber (e.g., 109, 209) may be filled with an outgassing film. In such configurations, the outgassing film may only outgas from a top surface. By forming the outgassing film 62 on the sidewalls of the vertically-extending cavities 69, but not completely filling the vertically-extending cavities 69, the surface area of the outgassing film 62, may be increased. As a result, an increase of outgas may be provided into a sealed chamber (such as the first sealed chamber 109) to increase the pressure inside the sealed chamber (such as the first sealed chamber 109). In many instances, the amount of outgas provided may be proportional to the exposed surface area of the outgassing film. In some embodiments, the vertically-extending cavity 69 depth may be greater than the thickness of the outgas sing film, but smaller than the thickness of a substrate (such as the MEMS support structure 500 or the cap structure 700). In some embodiments, the outgassing film 62 may comprise a stack of multiple films (621, 622, 623, 624) to increase outgas and provide additional functionality. For example, when a top film (i.e., the hydrophobic coating layer 624) is hydrophobic, the outgassing film 62 may provide outgas pressure, but may also reduce the possibility of stiction. Thus, the various embodiments disclosed herein may provide an increase in outgas pressure in the sealed chamber 109 while utilizing the same foot-print on the substrate as was utilized in a conventional approach. Thus, when only a small are may be provided to place outgassing film, the various embodiments disclosed herein may further increase the depth and surface area of the outgas sing film 62 to provide an increase in the quantity of the outgassed gases.

The various embodiments of the present disclosure may provide more outgassing material per area than prior art outgassing material structures by using at least one vertically-extending trench 69 in which more outgassing material can be deposited. Release of gas to a sealed chamber including a movable element can be effected by providing a vertically-extending surface of the outgas sing material in the at least one vertically-extending trench 69 such that the vertically-extending surface is physically exposed to a vertically-extending cavity 69' that is a portion of a sealed chamber containing the movable element, although an encapsulated vertically extending cavity 169' may be formed instead and a different surface of the outgassing material may be used to release gas into the sealed chamber. More amount of the outgassing material per area can provide higher chamber pressure in a sealed chamber for a MEMS device compared to prior art MEMS devices. Further, different MEMS devices may be provided with different numbers of vertically-extending cavities 69 to optimize the operating pressure of each sealed chamber located in the different MEMS devices.

According to an embodiment of the present disclosure, a micro-electro mechanical system (MEMS) device is provided, which comprises a MEMS support structure 500 bonded to a cap structure 700 through a matrix layer 10; a first movable element 10a located inside a first sealed chamber 109 that is laterally bounded by the matrix layer 10; at least one vertically-extending trench 69 that extends into the MEMS support structure 500 or a portion of the cap structure 700 that faces the matrix layer 10, and includes a respective vertically-extending outgassing material portion 50 (as contained in a respective outgassing-material-containing portion 62 having a surface in contact with (and thus, physically exposed to) a respective vertically-extending cavity (69' and/or 169'), wherein each vertically-extending outgassing material portion has a surface that is physically exposed to the first sealed chamber 109.

According to an embodiment of the present disclosure, a semiconductor chip is provided, which comprises: a MEMS support structure 500 bonded to a cap structure 700 through a matrix layer 10; a MEMS device 100 including a first movable element 10a located inside a first sealed chamber 109 that is laterally bounded by the matrix layer 10; a semiconductor circuit located in one of the MEMS support structure 500 and the cap structure 700 and configured to sense or control the MEMS device 100; at least one vertically-extending trench 69 that extends into the MEMS support structure 500 or a portion of the cap structure 700 that faces the matrix layer 10, and includes a respective vertically-extending outgassing material portion having a surface in contact with a respective vertically-extending cavity 69.

According to yet another aspect of the present disclosure, a method of forming a micro-electro mechanical system (MEMS) device is provided. A MEMS support structure 500 and a cap structure 700 may be provided to form at least one MEMS device. At least one vertically-extending trench 69 may be formed into the MEMS support structure 500 or a portion of the cap structure 700. A vertical-extending outgassing material portion 62 may be formed within the at least one vertically-extending trench 69. The vertical-extending outgassing material portion 62 may have a surface that is physically exposed to a respective vertically-extending cavity in each of the at least one vertically-extending trench. A matrix material layer 10L may be attached the MEMS support structure 500. A first movable element 10a laterally surrounded by a matrix layer 10 may be formed by patterning the matrix material layer 10L (or the thinned matrix material layer 10T). The matrix material layer 10L may be bonded to the cap structure 700 such that a first sealed chamber 109 containing the first movable element is formed. When bonded, each vertically-extending outgassing material portion 62 has a surface that is physically exposed to the first sealed chamber 109.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micro-electro mechanical system (MEMS) device, comprising:
 a MEMS support structure bonded to a cap structure through a matrix layer;
 a first movable element located inside a first sealed chamber that is laterally bounded by the matrix layer;
 a vertically-extending trench that extends into the MEMS support structure or a portion of the cap structure that faces the matrix layer; and
 a vertically-extending outgassing material portion located within the vertically-extending trench and exposed to the first sealed chamber, wherein the MEMS support structure comprises bonding-level metal interconnect structures in contact with a horizontal surface of the matrix layer, wherein the vertically-extending outgassing material portion contacts an adhesion promotion material layer which contacts a hydrophobic coating layer.

2. The MEMS device of claim 1, wherein each vertically-extending outgassing material portion has a surface that is physically exposed to the first sealed chamber.

3. The MEMS device of claim 1, wherein each vertically-extending outgassing material portion has a vertically-extending surface that is physically exposed to a void within the vertically-extending trench, the void being a portion of the first sealed chamber.

4. The MEMS device of claim 1, wherein;
the MEMS support structure comprises a semiconductor substrate; and
the vertically-extending trench extends into an upper portion of the semiconductor substrate.

5. The MEMS device of claim 1, wherein the vertically-extending trench has a tapered sidewall and has a variable width that decreases with a vertical distance from the matrix layer.

6. The MEMS device of claim 1, wherein the vertically-extending trench has a retro-tapered sidewall that provides a variable width for the vertically-extending trench that increases with a vertical distance from the matrix layer.

7. The MEMS device of claim 1, wherein the vertically-extending outgassing material portion comprises a portion of an outgassing-material-containing layer that includes a horizontally-extending portion contacting a horizontal surface of the MEMS support structure or a horizontal surface of the portion of the cap structure that faces the matrix layer.

8. The MEMS device of claim 1, wherein the vertically-extending outgassing material portion encloses an encapsulated vertically-extending cavity that is located entirely within the vertically-extending trench and not connected to the first sealed chamber.

9. The MEMS device of claim 1, wherein the vertically-extending outgassing material portion comprises a sidewall spacer including a vertically-extending void therein, and a bottom surface of the vertically-extending cavity is exposed to the vertically-extending void.

10. The MEMS device of claim 1, wherein the first sealed chamber is bounded by a horizontal capping surface of the portion of the cap structure that faces the matrix layer.

11. The MEMS device of claim 10, wherein the vertically-extending trench extends into the portion of the cap structure that faces the matrix layer and has a respective periphery that adjoins the horizontal capping surface.

12. A micro-electro mechanical system (MEMS) device, comprising:
a MEMS support structure bonded to a cap structure through a matrix layer;
a first movable element located inside a first sealed chamber that is laterally bounded by the matrix layer;
a vertically-extending trench that extends into the MEMS support structure or a portion of the cap structure that faces the matrix layer; and
a vertically-extending outgassing material portion located within the vertically-extending trench and exposed to the first sealed chamber, wherein the MEMS support structure comprises bonding-level dielectric layer in contact with a horizontal surface of the matrix layer.

13. The MEMS device of claim 12, wherein the MEMS support structure comprises an etch stop dielectric material layer contacting the bonding-level dielectric layer and vertically spaced from the matrix layer, wherein the first sealed chamber is vertically bounded by a horizontal surface of the etch stop dielectric material layer.

14. The MEMS device of claim 12, wherein:
the MEMS support structure comprises metal interconnect structures embedded in dielectric material layers and located between a MEMS substrate and the etch stop dielectric material layer; and
the vertically-extending trench extends through the etch stop dielectric material layer and into the dielectric material layers.

15. The MEMS device of claim 12, wherein:
the cap structure comprises a horizontal surface that is vertically offset from the matrix layer and is exposed to the first sealed chamber; and
the vertically-extending trench extends from the horizontal surface into the cap structure.

16. A micro-electro mechanical system (MEMS) device, comprising:
a MEMS support structure comprising a bonding-level dielectric layer that is bonded to a first horizontal surface of a matrix layer;
a cap structure comprising a bonding material layer that is bonded to a second horizontal surface of the matrix layer;
a first movable element located inside a first sealed chamber that is laterally bounded by the matrix layer and vertically bounded by the cap structure and the MEMS support structure;
a vertically-extending trench that extends into the MEMS support structure or into the cap structure; and
a vertically-extending outgassing material portion located within the vertically-extending trench.

17. The MEMS device of claim 16, wherein the vertically-extending outgassing material portion comprises a surface that is physically exposed to the first sealed chamber, and has a lateral thickness that is less than one half of a width of the vertically-extending trench.

18. The MEMS device of claim 16, wherein:
the MEMS support structure comprises multiple dielectric material layers located between a MEMS substrate and the first sealed chamber; and
the vertically extending trench extends into at least two dielectric material layers among the multiple dielectric material layers.

19. The MEMS device of claim 18, wherein:
the vertically-extending outgassing material portion has an outer sidewall that adjoins a horizontal reference surface that is selected from a horizontal surface of the MEMS support structure and a horizontal surface of the cap structure; and
the vertically-extending outgassing material portion has a vertical extent that is greater than a lateral dimension of the vertically-extending trench at a level of the horizontal reference surface, and has a lateral thickness that is less than one half of a lateral dimension of the vertically-extending trench.

20. The MEMS device of claim 16, wherein:
the MEMS support structure comprises a semiconductor substrate; and
the vertically-extending trench extends into an upper portion of the semiconductor substrate.

* * * * *